United States Patent [19]

Gorai et al.

[11] Patent Number: 5,089,820
[45] Date of Patent: Feb. 18, 1992

[54] RECORDING AND REPRODUCING METHODS AND RECORDING AND REPRODUCING APPARATUS

[75] Inventors: Yuji Gorai; Hiroshi Aoki, both of Tokyo, Japan

[73] Assignee: Seikosha Co., Ltd., Tokyo, Japan

[21] Appl. No.: 527,212

[22] Filed: May 22, 1990

[30] Foreign Application Priority Data

May 22, 1989 [JP] Japan ................... 1-128447
Feb. 1, 1990 [JP] Japan ................... 2-23348

[51] Int. Cl.⁵ ............................................. H03M 1/62
[52] U.S. Cl. ..................... 341/139; 341/155; 341/144; 360/32; 84/603; 381/29
[58] Field of Search ............... 341/132, 139, 143, 155, 341/158, 144; 369/32; 360/32; 84/603; 381/29

[56] References Cited

U.S. PATENT DOCUMENTS

| | | | |
|---|---|---|---|
| 3,187,323 | 6/1965 | Flood et al. | 341/139 |
| 3,411,153 | 11/1968 | Steele | 341/139 |
| 3,509,558 | 4/1970 | Cancro | 341/139 |
| 3,696,399 | 10/1972 | Klein et al. | 341/139 |
| 4,048,635 | 9/1977 | Bich | 341/144 |
| 4,091,379 | 5/1978 | Wu et al. | 341/132 |
| 4,177,457 | 12/1979 | Howlett | 341/144 |
| 4,583,074 | 4/1986 | Okamoto et al. | 364/718 |
| 4,603,321 | 7/1986 | Gutman et al. | 341/132 |
| 4,618,851 | 10/1986 | Watanabe | 341/139 |
| 4,701,872 | 10/1987 | Kitamura et al. | 341/95 |
| 4,851,842 | 7/1989 | Iwamatsu | 341/139 |
| 4,926,063 | 5/1990 | Donaldson | 307/144 |
| 4,970,594 | 11/1990 | Kitaura et al. | 358/172 |

Primary Examiner—Benjamin R. Fuller
Assistant Examiner—Randy W. Gibson
Attorney, Agent, or Firm—Jordan and Hamburg

[57] ABSTRACT

A recording method includes converting an original sound signal into a digital sound signal in a selected conversion range, selecting the conversion range in accordance with the amplitude information of the original sound signal, and storing and recording the digital sound signal. The apparatus includes a first selecting arrangement for selecting a conversion range which corresponds to amplitude information of an original sound signal, a converting arrangement for converting the original sound signal into a digital sound signal in the conversion range selected by the selecting arrangement, and a first memory for storing the digital sound signal converted by the first converting arrangement.

24 Claims, 20 Drawing Sheets

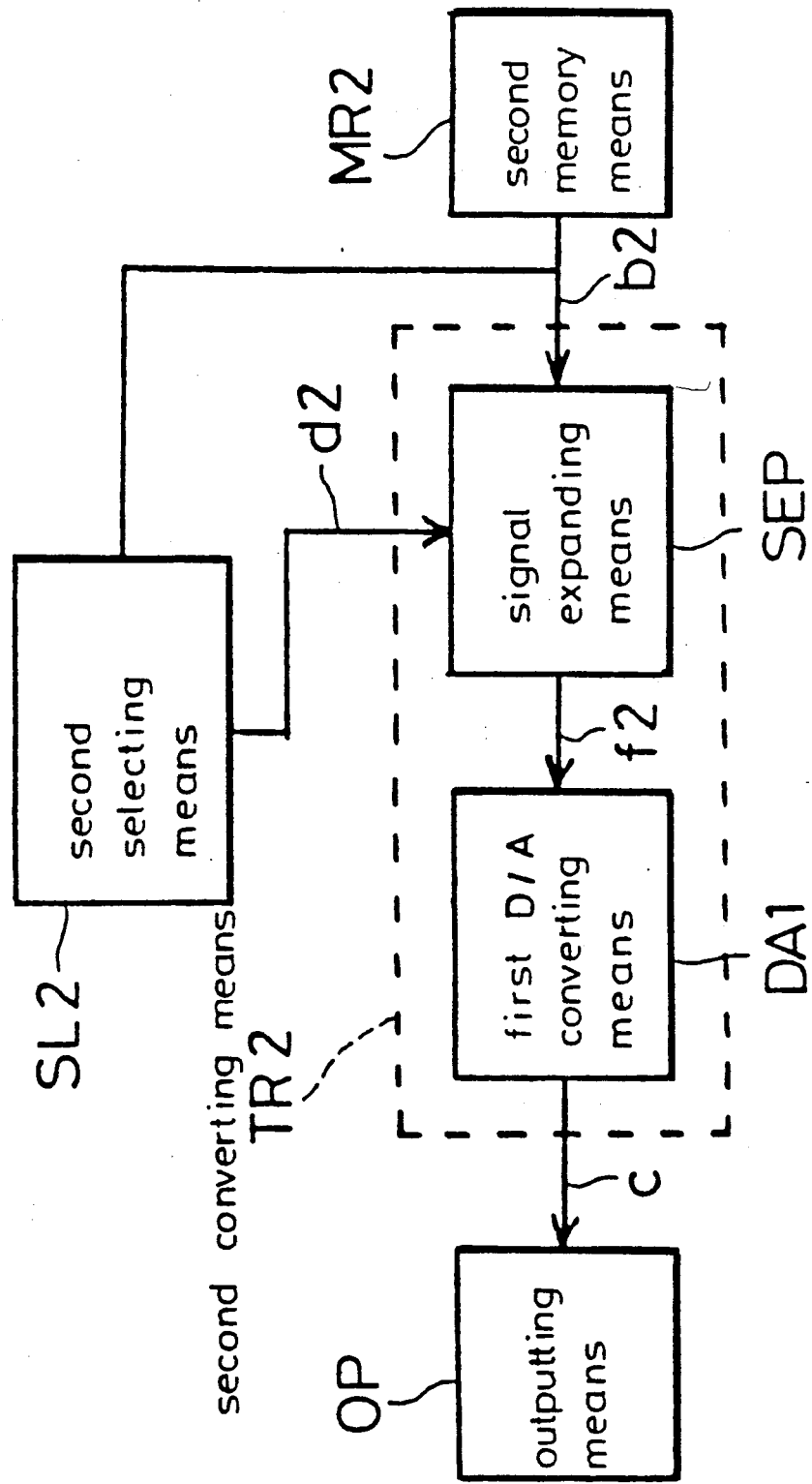

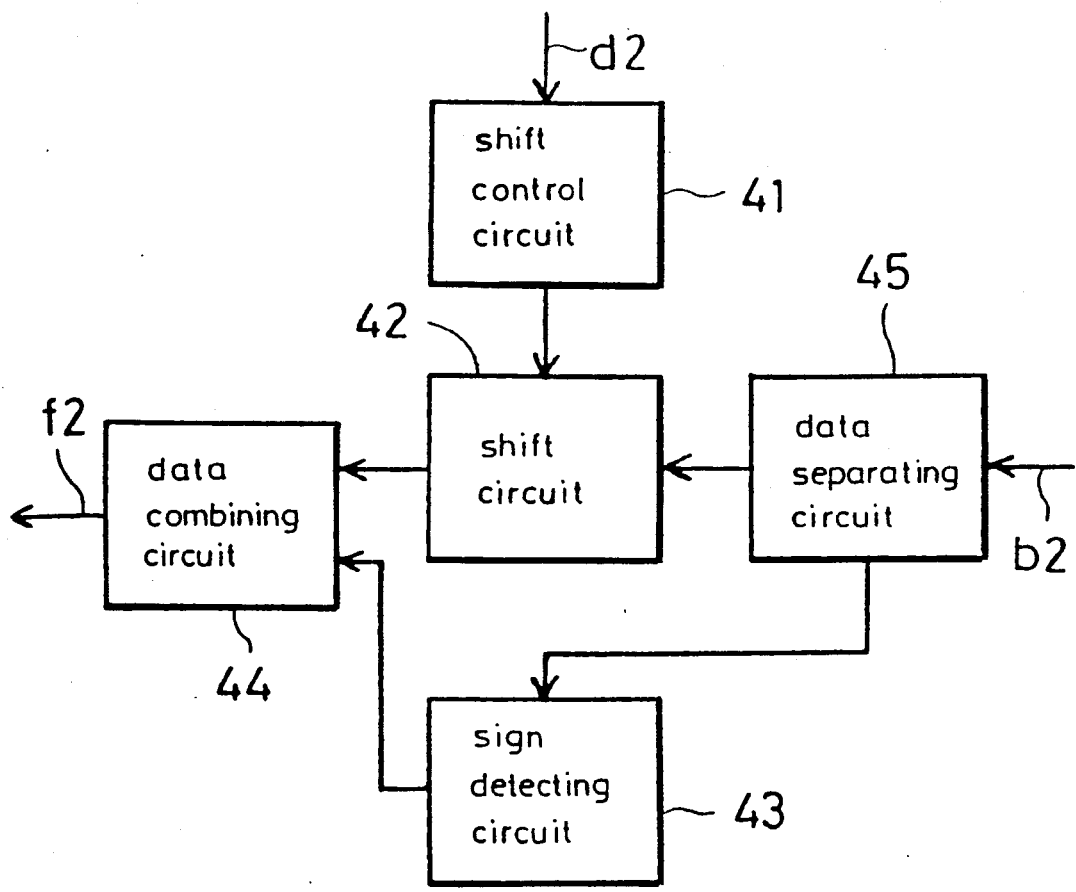
FIG. 12(A)
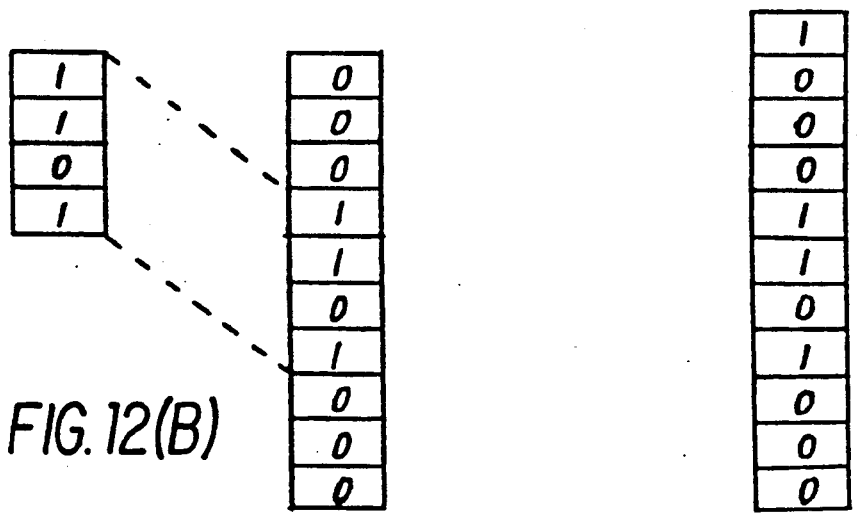
FIG. 12(B)
FIG. 12(C)

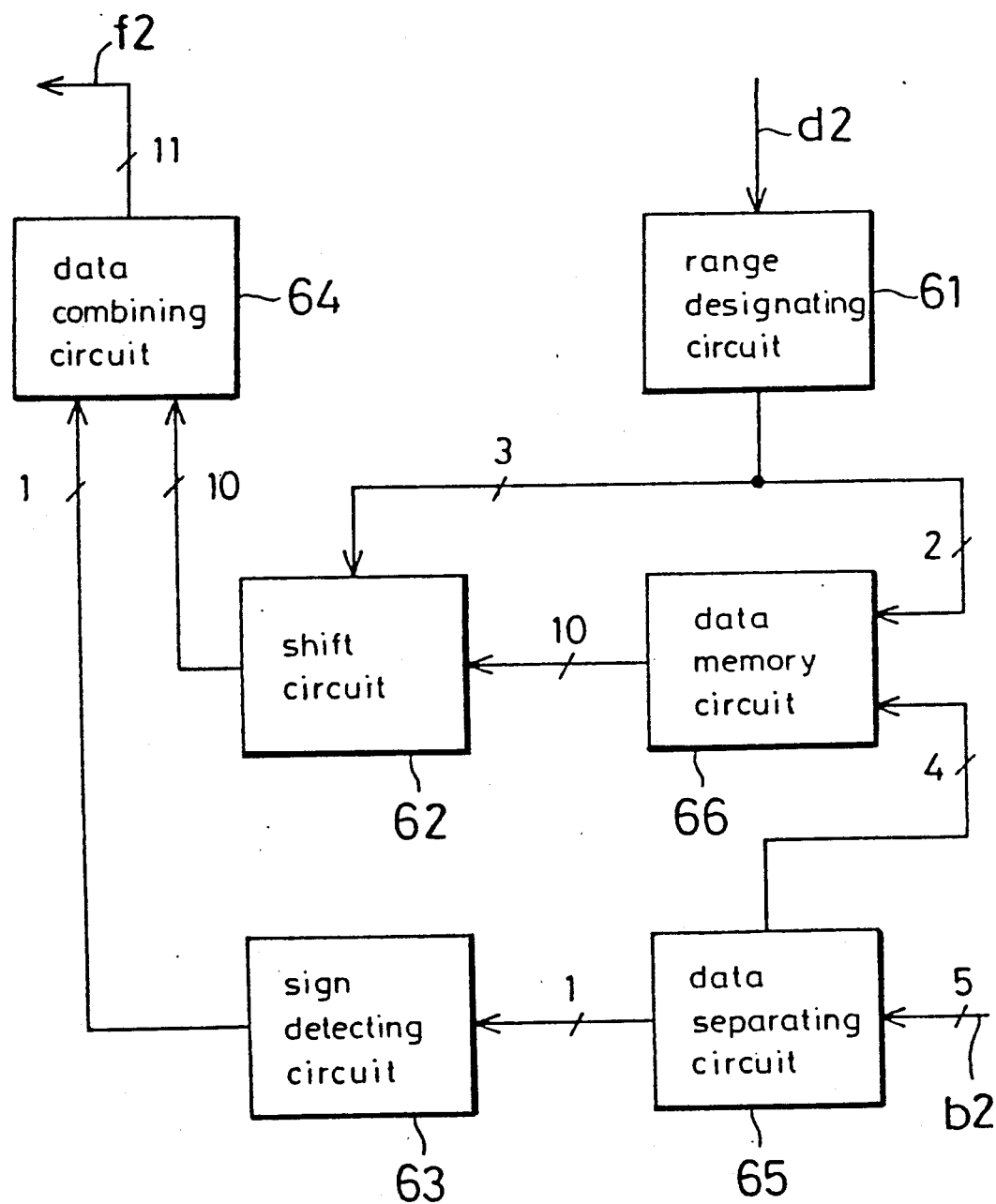
F I G. 18

FIG. 19

| Address | | Data | |
|---|---|---|---|
| Binary | Decimal | Binary | Decimal |
| 111111 | 63 | 1111000000 | 960 |
| . | . | . | . |
| . | . | . | . |
| . | . | . | . |
| 110000 | 48 | 0000000000 | 0 |
| 101111 | 47 | 1100100111 | 807 |
| . | . | . | . |
| . | . | . | . |
| . | . | . | . |
| 100000 | 32 | 0000000000 | 0 |
| 011111 | 31 | 1010100111 | 679 |
| . | . | . | . |
| . | . | . | . |
| . | . | . | . |
| 010000 | 16 | 0000000000 | 0 |
| 001111 | 15 | 1000111011 | 571 |
| . | . | . | . |
| . | . | . | . |
| . | . | . | . |
| 000000 | 0 | 00000000 | 0 |

FIG. 20

| Value of A | i | j |
|---|---|---|
| A 0   $(1/2)^{0/4}$ | 0 | 0 |
| A 0   $(1/2)^{1/4}$ | 0 | 1 |
| A 0   $(1/2)^{2/4}$ | 0 | 2 |
| A 0   $(1/2)^{3/4}$ | 0 | 3 |
| A 0   $(1/2)$   $(1/2)^{0/4}$ | 1 | 0 |
| A 0   $(1/2)$   $(1/2)^{1/4}$ | 1 | 1 |
| A 0   $(1/2)$   $(1/2)^{2/4}$ | 1 | 2 |
| A 0   $(1/4)$   $(1/2)^{3/4}$ | 1 | 3 |
| A 0   $(1/4)$   $(1/2)^{0/4}$ | 2 | 0 |
| A 0   $(1/4)$   $(1/2)^{1/4}$ | 2 | 1 |
| A 0   $(1/4)$   $(1/2)^{2/4}$ | 2 | 2 |
| A 0   $(1/4)$   $(1/2)^{3/4}$ | 2 | 3 |
| A 0   $(1/8)$   $(1/2)^{0/4}$ | 3 | 0 |
| ⋮ | ⋮ | ⋮ |

… width of each conversion range
RECORDING AND REPRODUCING METHODS AND RECORDING AND REPRODUCING APPARATUS

FIELD OF THE INVENTION

The present invention relates to recording and reproducing methods and recording and reproducing apparatus.

BACKGROUND OF THE INVENTION

PCM (Pulse Coded Modulation) systems are conventionally known for use in the recording and reproducing of sound signals such as speech and music.

An improved PCM system, i.e., an ADPCM (Adaptive Differential Pulse Coded Modulation) system, is also known.

A PCM system suffers from the problem that the amount of information to be stored is large.

On the other hand, an ADPCM system suffers from the problem that since the differential data between adjacent sound data is stored, it is impossible to follow a waveform having an amplitude that abruptly changes.

SUMMARY OF THE INVENTION

Accordingly, it is an object of the present invention to provide recording and reproducing methods and apparatus that require the storage of only a small amount of information and which are capable of following even a waveform having an amplitude that abruptly changes.

BRIEF DESCRIPTION OF THE DRAWINGS

FIGS. 9 and 10 are block diagrams of a third embodiment of the present invention;

FIGS. 17 and 18 are block diagrams of a sixth embodiment of the present invention;

FIG. 19 is an explanatory view of the data structure of the data memory circuit in FIG. 18; and FIG. 20 is an explanatory view of the principle of the sixth embodiment.

DESCRIPTION OF THE PREFERRED EMBODIMENTS

Embodiments of the present invention will be explained hereinafter with reference to the accompanying drawings.

Figure 3:
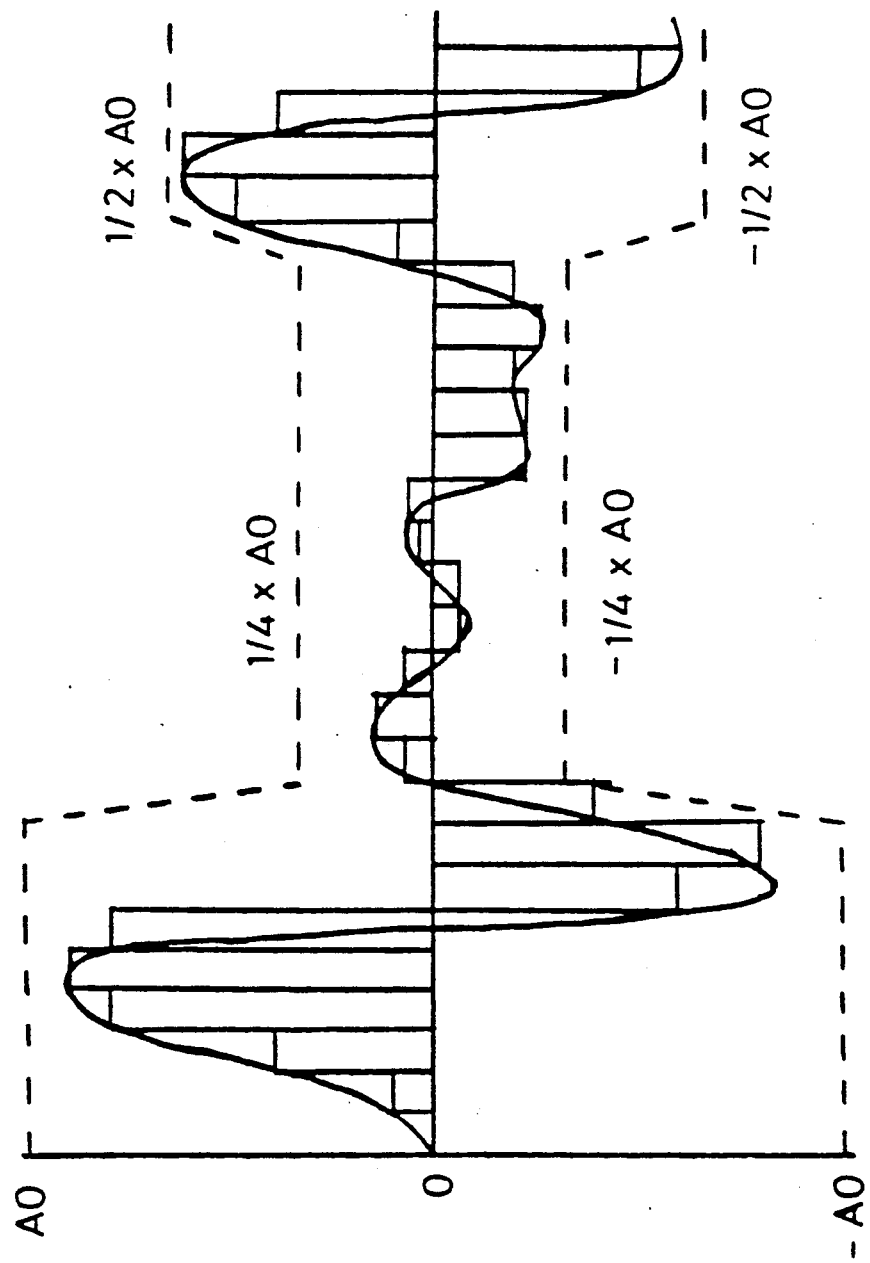
FIG. 3 is an exemplary view of the principle of the present invention.

As shown in FIG. 3, the principle of the present invention is to convert an original sound signal (the waveform represented by the solid line) into a digital sound signal in a conversion range (indicated by the broken lines) selected in correspondence with the amplitude of the original sound signal. In other words, when the amplitude of the original sound signal is large, the original sound signal is converted in a conversion range having a large width, while the original sound signal is converted in a conversion range having a small width when the amplitude of the original sound signal is small, as shown in FIG. 3. For example, if a digital sound signal is composed of a constant number of bits irrespective of the amplitude of the original sound signal in any conversion range, recording and reproduction with the same sound quality is possible.

Examples of the basic arrangement of a recording apparatus and a reproducing apparatus according to the present invention will be explained with reference to FIGS. 1 and 2.

Figure 1:
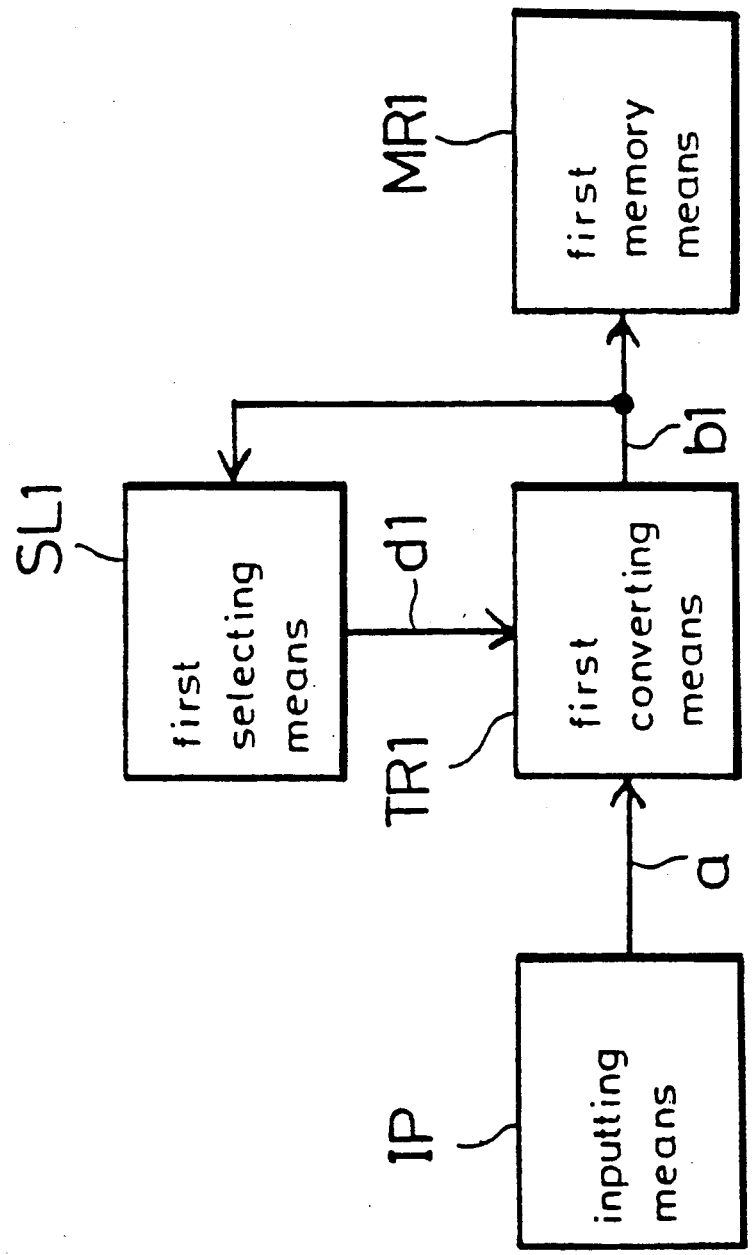
FIGS. 1 and 2 are block diagrams of examples of the fundamental structure of the present invention.

Although the recording apparatus shown in FIG. 1 and the reproducing apparatus shown in FIG. 2 may be independent of each other, the following explanation will be given on the assumption that the sound recorded by the recording apparatus shown in FIG. 1 is reproduced by the reproducing apparatus shown in FIG. 2, unless specified otherwise.

FIG. 1 is a block diagram of the example of the basic structure of a recording apparatus. The symbol IP represents an input means for outputting an original sound signal "a". In this embodiment, the input means IP is a microphone, an amplifier, etc., and inputs a sound such as speech and converts it into the original sound signal. The original sound signal is ordinarily an analog signal, but it may be converted into a digital signal.

The symbol SL1 represents a first selecting means for selecting a conversion range in correspondence with the amplitude of the original sound signal "a" output from the input means IP. The width of each conversion range is preferably selected so as to vary in geometrical progression. This is represented by the following equation:

$$A = A0 \cdot B^n \qquad (1)$$

wherein

A ... width of each conversion range
A0 ... width of the maximum conversion range
B ... positive number smaller than 1
n ... integer For example, if it is assumed that $B = \frac{1}{2}$ in the above equation, the widths of the respective conversion ranges are $\frac{1}{2} \times A0$, $\frac{1}{4} \times A0$, ... with respect to the width A0 of the maximum conversion range.

The symbol TR1 represents a first converting means for converting the original sound signal "a" into a digital sound signal in the conversion range selected by the first selecting means SL1, and outputting the digital sound signal "b1". The digital sound signal is ordinarily composed of a constant number of bits which do not vary with the conversion range.

The symbol MR1 represents a first memory means for storing the digital sound signal "b1" output from the first converting means TR1. The first memory means MR1 is generally composed of an RAM (Random Access Memory), etc.

The operation of the recording apparatus shown in FIG. 1 is as follows.

A sound such as speech and music is input to the inputting means IP. The sound is detected by the microphone, amplified by the amplifier and output as the original sound signal "a".

The first converting means TR1 converts the original sound signal "a" into digital data of a predetermined number of bits in the conversion range selected by the first selecting means SL1 at predetermined intervals and outputs the digital sound signal "b1". That is, the digital sound signal "b1" is obtained by subsequently converting the original sound signal "a" into digital data. The conversion range for this conversion is selected by the first selecting means SL1. The conversion range information d1 output from the first selecting means SL1 may be either the information indicating the width of the conversion range or the information for enlarging or narrowing the conversion range.

In this embodiment, the conversion range is selected by the first selecting means SL1 when the digital sound signal "b1" is input to the first selecting mans SL1. However, it is also possible to select the conversion range, for example, by inputting the original sound signal "a" to the first selecting means SL1. In other words, the signal for selecting the conversion range may be any signal which corresponds to the information on the amplitude of the original sound signal.

Each digital data of the digital sound signal "b1" output from the first converting mans TR1 is subsequently stored in the first memory means MR1.

Figure 2:
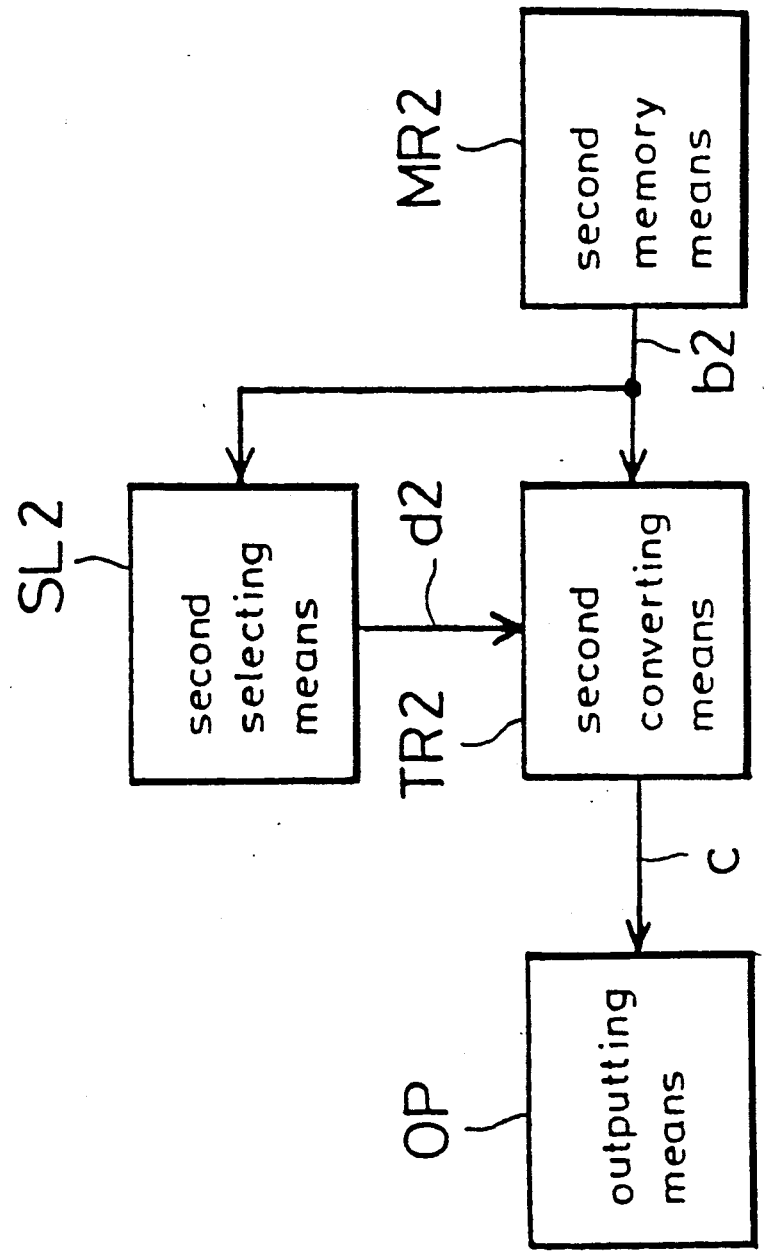

FIG. 2 is a block diagram of the basic structure of a reproducing apparatus.

The symbol MR2 represents a second memory means for storing a digital sound signal. The second memory means MR2 is generally composed of ROM (Read Only Memory), etc. The digital sound signal is ordinarily composed of a constant number of bits which does not vary with the conversion range. The digital sound signal used in the recording means is preferably used as the digital sound signal stored in the second memory means MR2.

The symbol SL2 represents a second selecting mans for selecting a conversion range in correspondence with the information on the amplitude of a digital sound signal "b2" output from the second memory means MR2. The width of each conversion range is preferably selected in correspondence with the first selecting means SL1 in the recording apparatus. In other words, the width of each conversion range is preferably selected so as to vary in geometrical progression.

The symbol TR2 represents a second converting means for converting the digital sound signal "b2" into an analog sound signal "c" in the conversion range selected by the second selecting means SL2.

The symbol OP represents an outputting means for inputting the analog sound signal "c". In this embodiment, the outputting means OP is composed of an amplifier, a speaker, etc., and inputs the analog sound signal "c" and converts it into a sound output.

The operation of the reproducing apparatus shown in FIG. 2 is as follows.

Each digital data on the digital sound signal "b2" output from the second memory means MR2 is subsequently input to the second converting means TR2 and converted into the analog sound signal "c" in the conversion range selected by the second selecting means SL2. The conversion range information d2 output from the second selecting means SL2 may be either the information indicating the width of the conversion range or the information for enlarging or narrowing the conversion range.

In this embodiment, the conversion range is selected by the second selecting means SL2 when the digital sound signal "b2" is input to the second selecting means SL2. However, it is also possible to select the conversion range, for example, by inputting the analog sound signal "c" to the second selecting means SL2. In other words, the signal for selecting the conversion range may be any signal which corresponds to the information on the amplitude of the original sound signal.

The analog sound signal "c" output from the second converting means TR2 is input to the output means OP, amplified by the amplifier and output from the speaker as a sound.

In the example of the basic apparatus explained above, since the original sound signal is converted into the digital sound signal in the converting range selected in correspondence with the amplitude of the original sound signal at the time of recording, while the digital sound signal is converted into the analog sound signal in the converting range selected in correspondence with the amplitude of the digital sound signal at the time of reproduction, a recording apparatus and a reproducing apparatus are provided which require only a small amount of information to be stored and are capable of following a waveform having an amplitude that abruptly changes.

Each component of the recording apparatus and the reproducing apparatus described above will now be explained with reference to the following examples.

The structure of the following examples is the same as above discussed unless specified otherwise.

EXAMPLE 1

Figure 4:
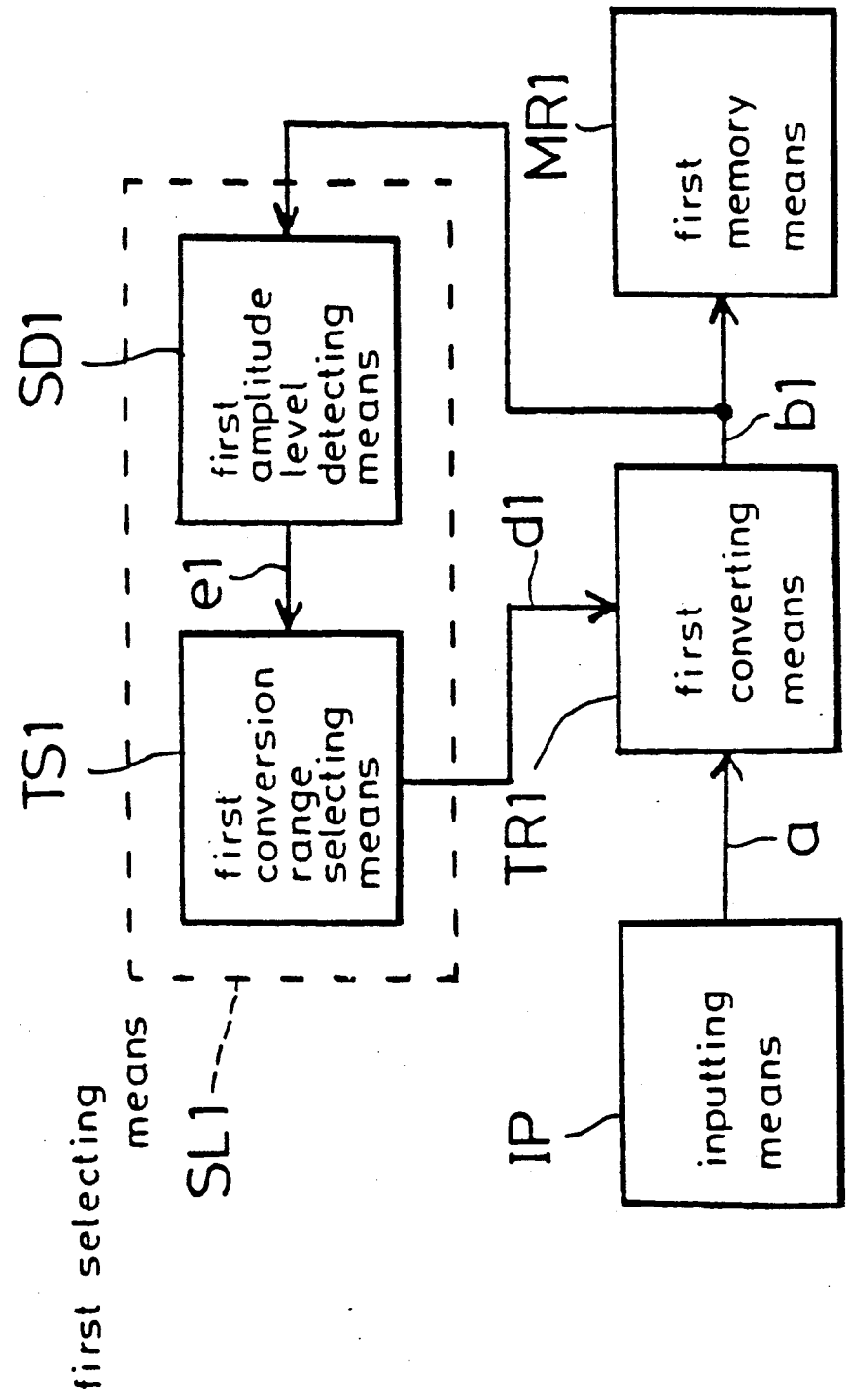
FIGS. 4 and 5 are block diagrams of a first embodiment of the present invention.
Figure 5:
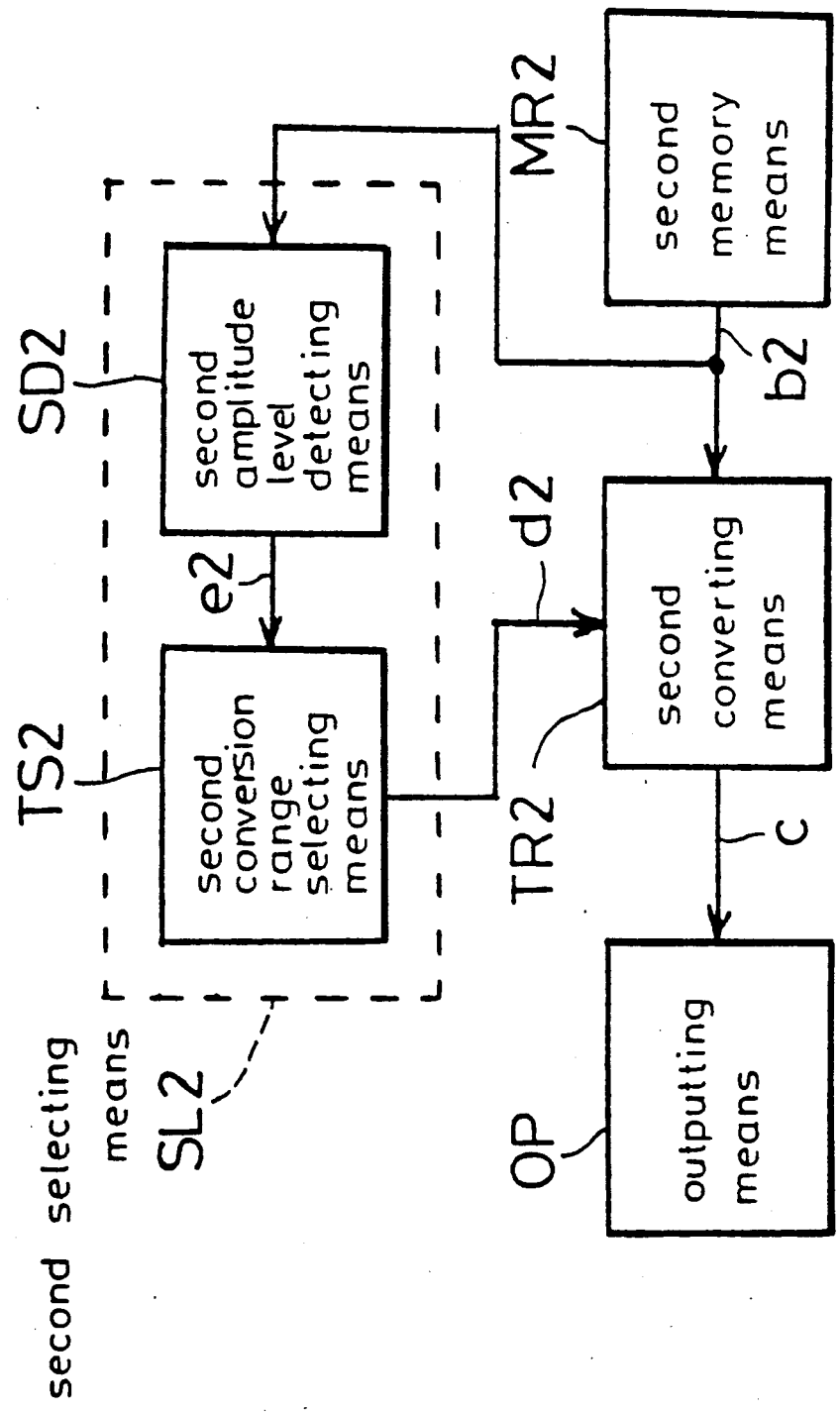

A first example of the invention based on the recording apparatus and the reproducing apparatus described above with reference to FIGS. 1 and 2 will be disclosed with reference to FIGS. 4 and 5, respectively.

Although the recording apparatus shown in FIG. 4 and the reproducing apparatus shown in FIG. 5 may be independent of each other, the following explanation will be given on the assumption that the sound recorded by the recording apparatus shown in FIG. 4 is reproduced by the reproducing apparatus shown in FIG. 5, unless specified otherwise.

Referring to FIG. 4, the inputting means IP, the first memory means MR1 and the first converting means TR1 are the same as those described with reference to FIGS. 1 and 2.

The first selecting means SL1 is comprised of a first amplitude level detecting means SD1 and a first conversion range selecting means TS1.

The first amplitude level detecting means SD1 detects the amplitude level which corresponds to the information on the amplitude of the original sound signal "a" output from the inputting means IP. In this embodiment, the digital sound signal "b1" is input to the first amplitude level detecting means SD1, as shown in FIG. 4. However, the signal input to the first amplitude level detecting means SD1 may be any signal that corresponds to the information on the amplitude of the original sound signal.

The first conversion range selecting means TS1 receives the amplitude level information detected by the first amplitude level detecting means SD1 and selects the optimum conversion range.

The operation of the recording apparatus shown in FIG. 4 is as follows.

The original sound signal "a" is input to the first converting means TR1 and subsequently converted into the digital data on the digital sound signal "b1" in the conversion range selected by the first conversion range selecting means TS1.

Each digital data on the digital sound signal "b1" is stored in the first memory means MR1 and is also subsequently input to the first amplitude level detecting means SD1, wherein the amplitude level is detected for each digital data.

Each amplitude level information detected for each digital data on the digital sound signal "b1" is subsequently input to the first conversion range selecting means TS1, and the optimum conversion range is selected on the basis of continuous information (e.g., for 128 bytes) on the respective amplitude levels.

Referring to FIG. 5, the outputting means OP, the second memory means MR2 and the second converting means TR2 of the reproducing apparatus are the same as those described with reference to the basic apparatus of FIGS. 1 and 2.

The second selecting means SL2 is comprised of a second amplitude level detecting means SD2 and a second conversion range selecting means TS2.

The second amplitude level detecting means SD2 detects the amplitude level which corresponds to the information on the amplitude of the digital sound signal "b2" output from the second memory means MR2. In this embodiment, the digital sound signal "b2" is input to the second amplitude level detecting means SD2, as shown in FIG. 5. However, the signal input to the second amplitude level detecting means SD2 may be any signal that corresponds to the information on the amplitude of the digital sound signal.

The second conversion range selecting means TS2 receives the amplitude level information detected by the second amplitude level detecting means SD2 and selects the optimum conversion range.

The operation of the recording apparatus shown in FIG. 5 is as follows:

Each digital data on the digital sound signal "b2" output from the second memory means MR2 is input to the second converting means TR2 and is also subsequently input to the second amplitude level detecting means SD2, wherein the amplitude level is detected for each digital data.

Each amplitude level information detected for each digital data on the digital sound signal "b2" is subsequently input to the second conversion range selecting means TS2, and the optimum conversion range is selected on the basis of continuous information (e.g., for 128 bytes) on the respective amplitude levels.

The second converting means converts the digital sound signal "b2" into the analog sound signal "c" in the conversion range selected by the second conversion range selecting means TS2.

Example of the first conversion range selecting means TS1, the second conversion range selecting means TS2, the first amplitude level detecting means SD1 and the second amplitude level detecting means SD2 and the operations thereof will now be explained.

Figure 6:
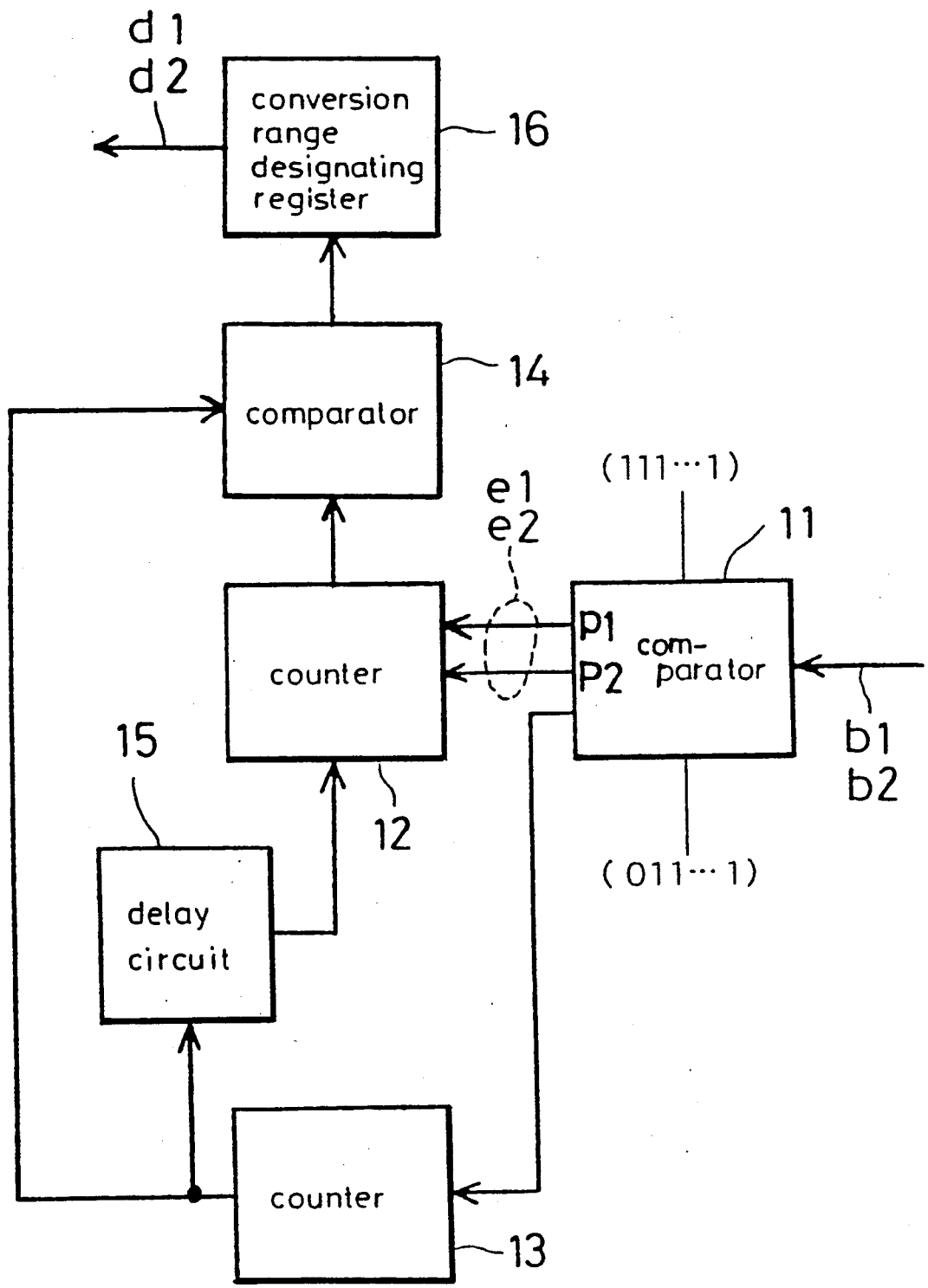
FIG. 6 is a block diagram which concretely shows a part of the first embodiment.

The first conversion range selecting means TS1 and the second conversion range selecting means TS2 may have the same structure, and the first amplitude level detecting means SD1 and the second amplitude level detecting means SD2 may also have the same structure. These structures are shown in FIG. 6.

Each of the digital data b1 and b2 of the digital sound signals input to or output from the first conversion means TR1 and the second conversion means TR2 shown in FIGS. 4 and 5 is applied to a comparator 11.

The comparator 11 determines whether or not the value of the amplitude level contained in the digital sound signal b1 or b2 is larger than the maximum value (111 ... 1) in the current conversion range and the maximum value (011 ... 1) in the conversion range that is half as large as the current conversion range. If the value of b1 or b2 is larger than the maximum value of the current range, "1" is output to a terminal P1, while "1" is output to a terminal "P2" if the value of b1 or b2 is smaller than half the current range.

Every time "1" is output from the terminal P1 or P2 of the comparator 11, "1" is selectively added to the value of a separate counter of counter 12, in dependence upon whether the count was output from the terminal P1 or from the terminal P2. Every time an item of data is input to the comparator 11, "1" is added to the value of a counter 13 (having a number system with 128 as a base).

When the count stored in the counter 13 reaches "128", a first count value of the number of outputs P1 larger than the maximum value (111 ... 1) in the current conversion range and a second count value of the number of outputs P2 larger than the maximum value (011 . .. 1) in the conversion range half as larger as the current conversion range are output from the counter 12. A comparator 14 compares the respective first and second count values with a first reference value (assumed to be "3") and a second reference value (assumed to be "3"), respectively. When the first count value of the counter 12 is not smaller than the first reference value "3", the conversion range of a conversion range specifying register 16 is enlarged by one stage. On the other hand, when the second count value of the counter 12 is not greater than the second reference value "3", the conversion range of a conversion range specifying register 16 is narrowed by one stage. As a result, the conversion range specifying register 16 outputs the optimum conversion range information d1 and d2.

The counter stored in the counter 12 is cleared via a delay circuit 15 by the output of the counter 13 after the end of the comparing operation of the comparator 14.

The recording apparatus and the reproducing apparatus in this embodiment can automatically select the conversion range set by the first conversion range selecting means TS1 and the second conversion range selecting means TS2. Since automatic selection of the conversion range is possible, it is unnecessary to store the conversion range information in the first memory means MR1 and the second memory means MR2, thereby enabling the reduction of the storage capacity.

EXAMPLE 2

Figure 7:
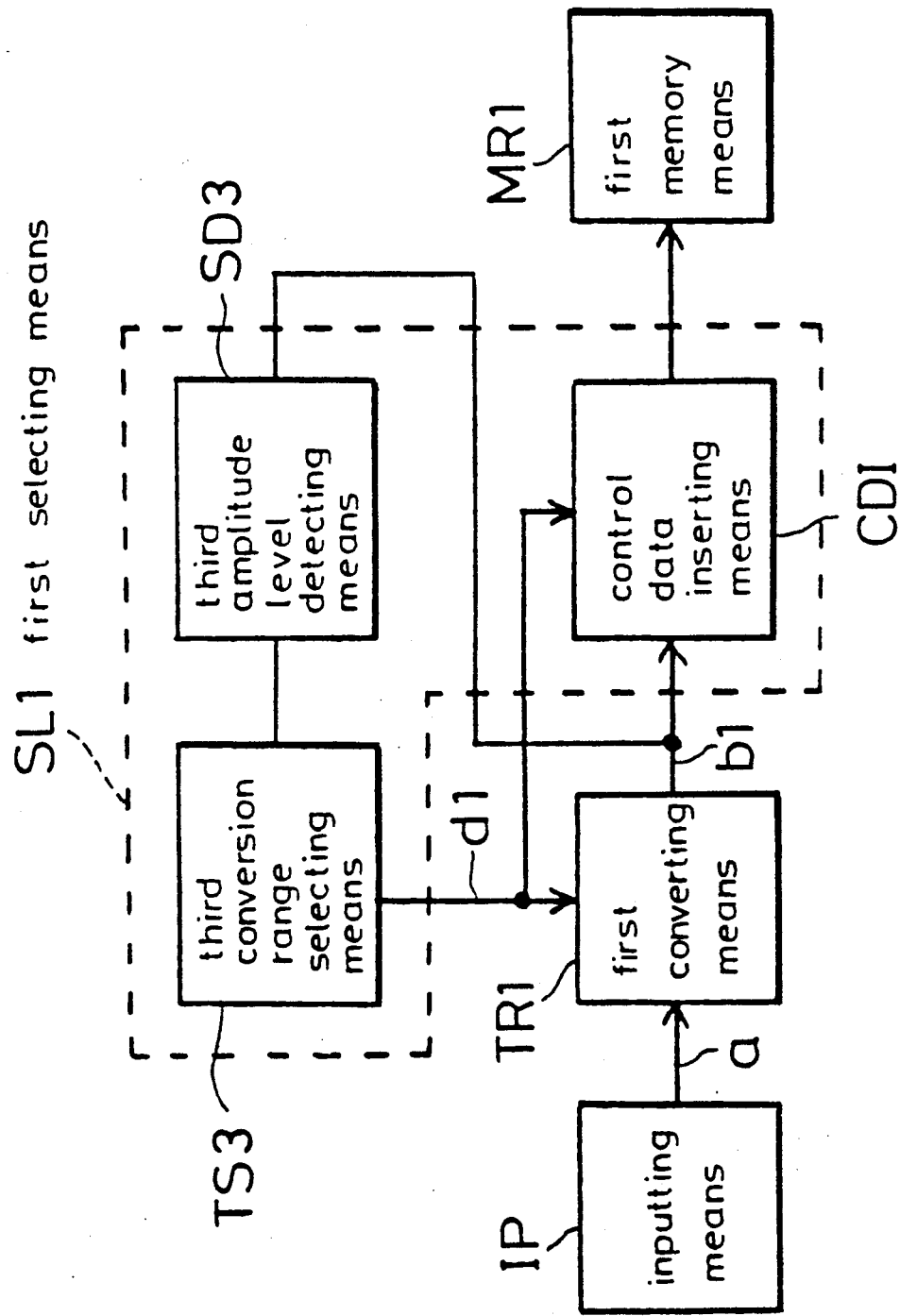
FIGS. 7 and 8 are block diagrams of a second embodiment of the present invention.
Figure 8:
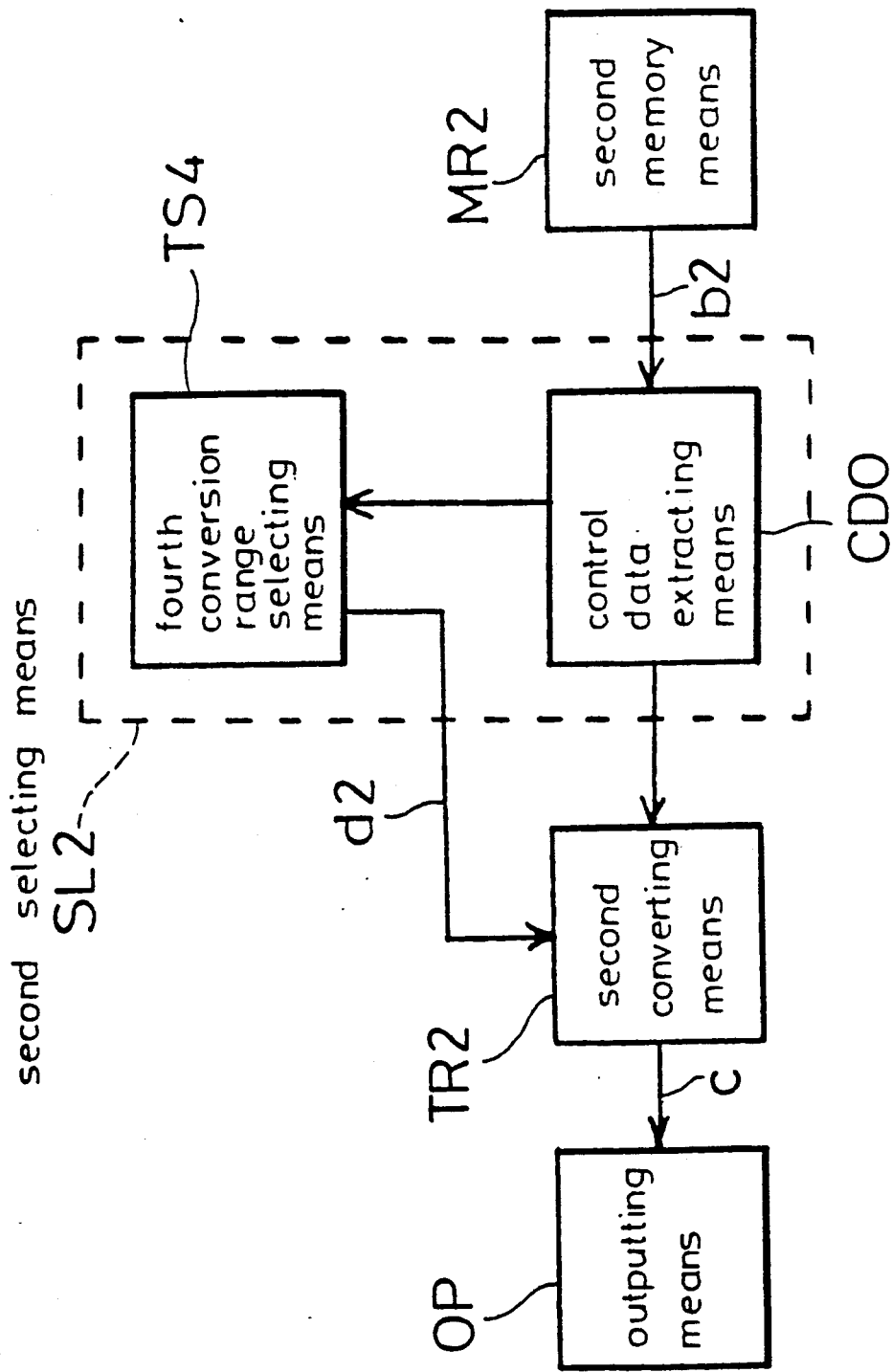

A second embodiment based on the recording apparatus and the reproducing apparatus described above with reference to the basic arrangement of FIGS. 1 and 2 will be disclosed with reference to FIGS. 7 and 8.

Although the recording apparatus shown in FIG. 7 and the reproducing apparatus shown in FIG. 8 may be independent of each other, the following explanation will be given on the assumption that the sound recorded by the recording apparatus shown in FIG. 7 is reproduced by the reproducing apparatus shown in FIG. 8, unless specified otherwise.

The inputting means IP, the first memory means MR1 and the first converting means TR1 are the same as those described above with reference to the basic arrangement of FIGS. 1 and 2.

The first selecting means SL1 comprises a third amplitude level detecting means SD3, a third conversion range selecting means TS3 and a control data inserting means CDI.

The third amplitude level detecting means SD3 and the third conversion range selecting means TS3 are similar to the first amplitude level detecting means SD1 and the first conversion range selecting means TS1 described above with reference to Example 1.

The control data inserting means CDI inserts the information on the conversion range selected by the third conversion range selecting means TS3 into each digital data on the digital sound signal "b1" which is output from the first converting means TR1.

The operation of the recording apparatus shown in FIG. 7 is as follows.

The original sound signal "a" is input to the first converting means TR1 and subsequently converted into the digital data on the digital sound signal "b1" in the conversion range selected by the third conversion range selecting means TS3.

Each digital data of the digital sound signal "b1" is input to the control data inserting means CDI and is also subsequently input to the third amplitude level detecting mans SD3, wherein the amplitude level is detected for each digital data.

The third conversion range selecting means TS3 carries out a similar operation to that in Example 1 explained in FIG. 6 so as to select the conversion range.

The control data inserting means CDI carries out one of the following operations (1) to (3).

(1) To insert conversion range information for each digital data of the digital sound signal "b1".

(2) To insert conversion range information for every predetermined number of items of digital data of the digital sound signal "b1". For example, conversion range information of 1 byte is inserted for every 128 bytes of digital data of the digital sound signal "b1".

(3) To insert conversion range information every time the conversion range changes.

The data to be inserted in the operations (1) to (3) may be either a conversion range itself or information for enlarging or narrowing the conversion range.

The conversion range information output from the control data inserting means CDI is output together with the digital sound signal and stored in the first memory means MR1.

FIG. 8 is a block diagram of a second embodiment of the reproducing apparatus.

The outputting means OP, the second memory means MR2 and the second converting means TR2 are the same as those described with reference to the basic arrangement of FIGS. 1 and 2.

The second selecting means SL2 comprises a control data extracting means CDO and a fourth conversion range selecting means TS4.

The control data extracting means CDO extracts the conversion range information which is output together with the digital sound signal from the second memory means MR2.

The fourth conversion range selecting means TS4 selects the conversion range on the basis of the conversion range information extracted by the control data extracting means CDO.

The operation of the recording apparatus shown in FIG. 8 is as follows.

The second memory means MR2 outputs conversion range information together with the digital sound signal. The conversion range information extracted by the control data extracting means CDO is supplied to the fourth conversion range selecting means TS4. The digital sound signal is supplied to the second converting means TR2 and converted into the analog sound signal "c" in the conversion range selected by the fourth conversion range selecting means TS4.

The data stored in the first memory means MR1 shown in FIG. 7 is stored in the second memory means MR2. Therefore, the data inserted by the control data inserting means CDI shown in FIG. 7 is extracted by the control data extracting means CDO.

The fourth conversion range selecting means TS4 selects the conversion range on the basis of the conversion range information extracted by the control data extracting means CDO.

The recording apparatus and the reproducing apparatus in this embodiment are capable of storing conversion range information separately from the digital sound signal by virtue of the control data inserting means CDI and the control data extracting means CDO. It is therefore possible to simplify the structure of, especially, the reproducing apparatus.

EXAMPLE 3

A third embodiment based on the recording apparatus and the reproducing apparatus described with reference to FIGS. 1 and 2 will be explained with reference to FIGS. 9 and 10.

Figure 9:
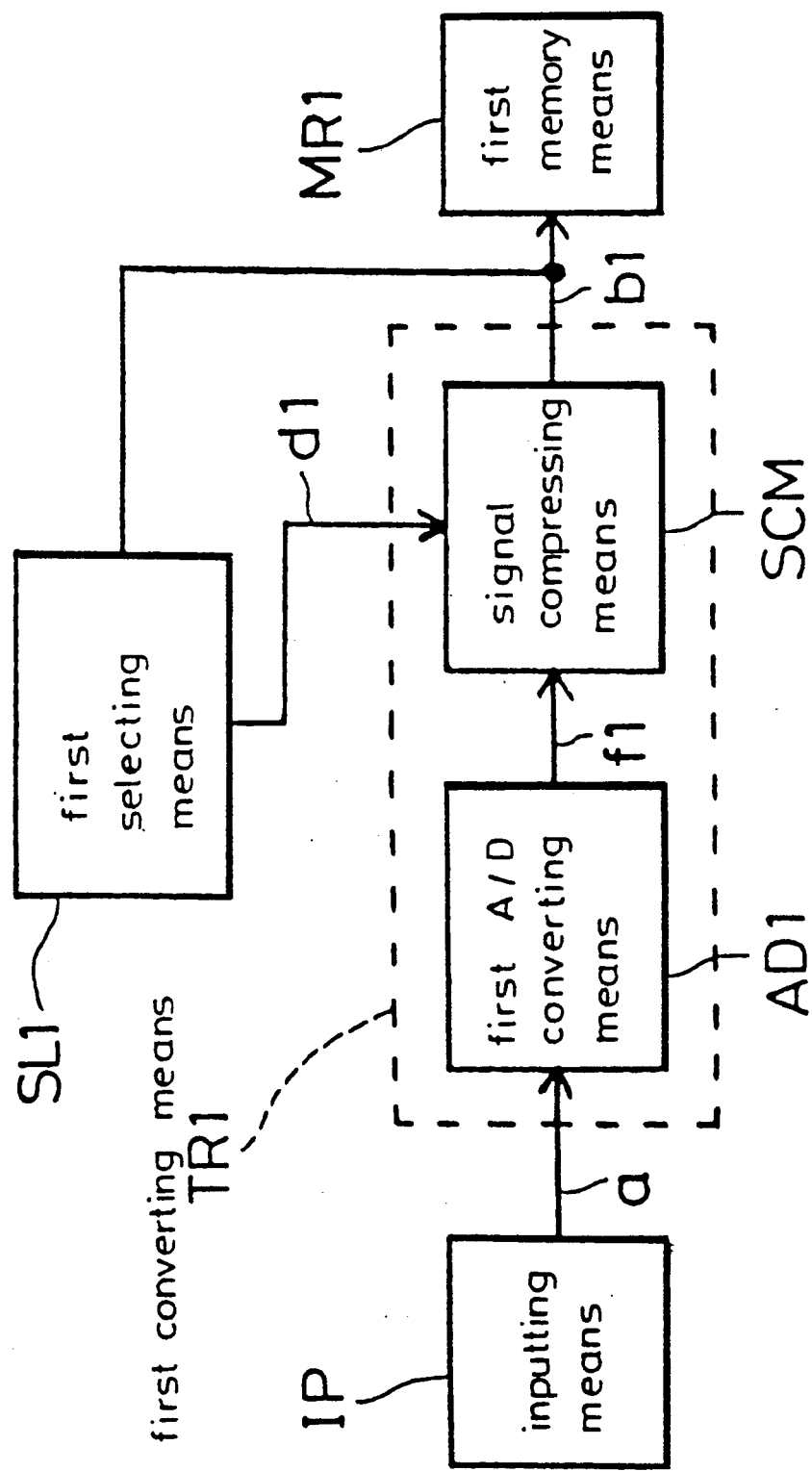

Although the recording apparatus shown in FIG. 9 and the reproducing apparatus shown in FIG. 10 may be independent of each other, the following explanation will be given on the assumption that the sound recorded by the recording apparatus shown in FIG. 9 is reproduced by the reproducing apparatus shown in FIG. 10, unless specified otherwise.

The inputting means IP, the first memory means MR1 and the first selecting means SL1 are the same as those described above with reference to the basic arrangement of FIGS. 1 and 2.

The first converting mans TR1 comprises a first A/D converting means AD1 and a signal compressing means SCM.

The first A/D converting means AD1 converts the original analog sound signal "a" input from the inputting means IP into a digital signal.

The signal compressing mans SCM converts the A/D conversion signal "f1" obtained from the first A/D converting means AD1 into a compression signal of a smaller number of bits than the number of bits of the A/D conversion signal "f1" in a conversion range selected by the first selecting means SL1, thereby obtaining the digital sound signal "b1".

The operation of the recording apparatus shown in FIG. 9 is as follows.

The original analog sound signal "a" is converted into a digital signal by the first A/D converting means AD1 to obtain the A/D conversion signal "f1". The number of bits of the A/D conversion signal "f1" may be appropriately selected, but the A/D conversion signal "f1" is here assumed to be composed of 11 bits (1 bit of them is a sign bit).

The signal compressing means SCM converts the A/D conversion signal "f1" into a compression signal of a smaller number of bits (it is assumed here to be 5 bits, 1 bit of them being a sign bit) than the number of bits of the A/D conversion signal "f1" in a conversion range selected by the first selecting means SL1. As a result, the digital sound signal "b1" is output from the signal compression means SCM.

The digital sound signal "b1" is stored in the first memory means MR1 and is also input to the first selecting means SL1, which outputs the conversion range information.

An example of the signal compressing means SCM and the operation thereof will be explained with reference to FIGS. 11(A-C).

In the example shown in FIGS. 11(A-C), the width of the corresponding conversion ranges is $\frac{1}{2} \times A0$, $\frac{1}{4} \times A0$, ... with respect to the width A0 of the maximum conversion range shown in FIG. 3.

The principle thereof will first be explained.

For example, when the conversion range is changed from A0 to $\frac{1}{2} \times A0$, the binary value "0111" in the former conversion range is represented by the binary value "1110" in the latter conversion range. This is equivalent to shifting the data by 1 bit. That is, when the conversion range is reduced by $\frac{1}{2}$, the data represented by the binary code is shifted by 1 bit. Similarly, when the conversion range is reduced to $\frac{1}{4}$, the data represented by the binary code is shifted by 2 bits. FIG. 11(B) represents the case of changing the conversion range from the maximum conversion range to $\frac{1}{8}$ thereof, and the data is shifted by 3 bits.

The example shown in FIGS. 11(A-C) will be explained with reference to the above-described principle.

Figure 11A:
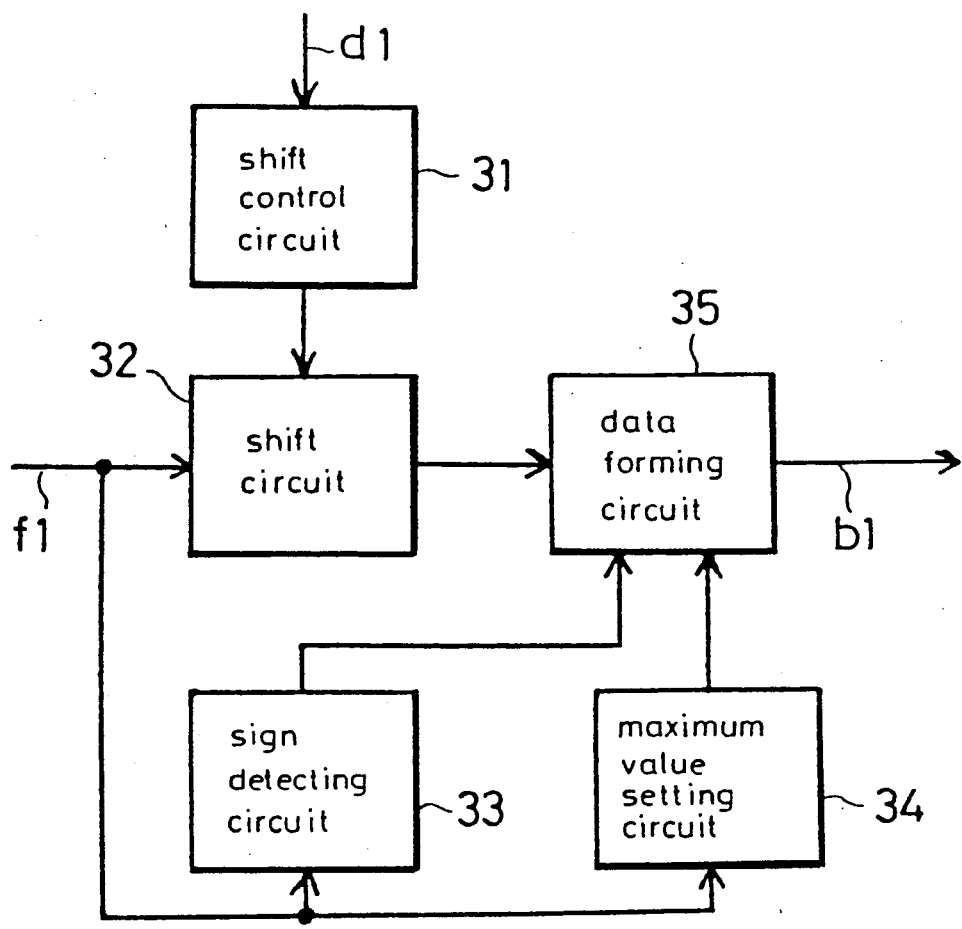
FIGS. 11(A-C) and 12(A-C) are block diagrams which concretely show a part of the third embodiment.
Figure 11B:
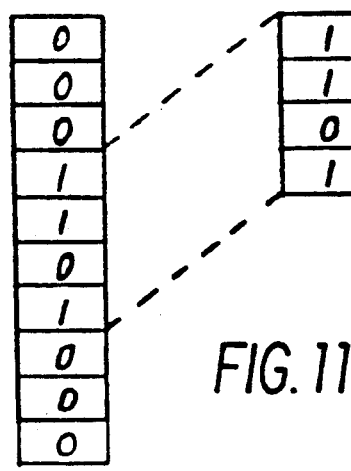

FIG. 11(A) shows the signal compressing means SCM in the embodiment shown in FIG. 9.

The conversion range information "d1" is supplied from the first selecting means SL1 shown in FIG. 9 to a shift control circuit 31. The conversion range information "d1" may be either the information indicating the width of the conversion range or information for enlarging or narrowing the conversion range. Shift data is output from the shift control circuit 31 on the basis of the conversion range information "d1".

A shaft circuit 32 outputs an absolute value signal of 4 bits by shifting the absolute value bits of the A/D conversion signal "f1" of 11 bits (1 bit is a sign bit and the other bits are absolute value bits) on the basis of the shift data output from the shift control circuit 31.

The A/D conversion signal "f1" is also input to a sign detecting circuit 33 and the sign bit is extracted.

A maximum value setting circuit 34 sets the absolute value signal at the maximum value when the data overflows the conversion range.

Figure 11C:
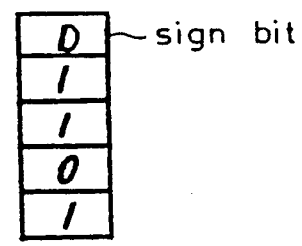

A compression data forming means forms a compression signal comprised of a sign bit (1 bit) and absolute value bits (4 bits) on the basis of the data obtained from the shift circuit 32, the sign detecting circuit 33 and the maximum value setting circuit 34, as shown in FIG. 11(C), and outputs the digital sound signal b1.

FIG. 10 is a block diagram of a third embodiment of the reproducing apparatus.

The outputting means OP, the second memory means MR2 and the second selecting means SL2 are the same as those described above with reference to the basic arrangement of FIGS. 1 and 2.

The second converting means TR2 is comprised of a first D/A converting means DA1 and a signal expanding means SEP.

The signal expanding means SEP converts the digital sound signal "b2" into an expansion signal "f2" of a larger number of bits than the number of bits of the digital sound signal "b2" in the conversion range selected by the second selecting means SL2.

The first D/A converting means DA1 converts the expansion signal "f2" output from the signal expanding means SEP from the digital signal into an analog signal.

The operation of the reproducing apparatus shown in FIG. 10 is as follows.

The digital sound signal "b2" (it is assumed here to have 5 bits, 1 bit of them being a sign bit) is input to the second selecting means SL2 and also input to the signal expanding means SEP.

The signal expanding means SEP converts the digital sound signal "b2" into the expansion signal "f2" of 11 bits (1 bit thereof is a sign bit) in the conversion range selected by the selecting means SL2.

The first D/A converting means DA1 converts the expansion signal "f2" from the digital signal into an analog signal and outputs the analog sound signal "c".

An example of the signal expanding means SEP and the operation thereof will be explained with reference to FIGS. 12(A-C).

In the example shown in FIGS. 12(A-C), the widths of the corresponding conversion ranges are $\frac{1}{2} \times Amx$, $\frac{1}{4} \times Amx$ ... with respect to the width Amx of the maximum conversion range.

The fundamental principle of the operation of the signal expanding means SEP is reverse to the operation of the signal compressing means SCM which has already been described with reference to FIG. 11.

FIGS. 12(A) shows a signal expanding means SEP in the embodiment shown in FIG. 10.

To a data separating means 45, the digital sound signal "b2" comprised of a sign bit (1 bit) and absolute value bits (4 bits) is input. The digital sound signal "b2" input to the data separating means 45 is separated into the sign bit and the absolute value bits (absolute value signal).

The conversion range information "d2" is supplied from the second selecting means SL2 shown in FIG. 10 to a shift control circuit 41. The conversion range information "d2" may be either information indicating the width of the conversion range or information for enlarging or narrowing the conversion range. Shift data is output from the shift control circuit 41 on the basis of the conversion range information "d2".

The shift circuit 42 outputs a D/A conversion signal of 10 bits by shifting the absolute value signal of 4 bits on the basis of the shift data output from the shift control circuit 41, as shown in FIG. 12(B). The bits other than the 4 bits of the shifted absolute value signal become 0.

A data combining means 44 combines the D/A conversion signal of 10 bits and the sign signal of 1 bit output from the sign detecting means 43 into a signal of 11 bits such as that shown in FIG. 12(C) and supplied it to the first D/A converting means DA1 shown in FIG. 10.

The recording apparatus and the reproducing apparatus in this embodiment are capable of reducing the amount of information to be stored by virtue of the signal compressing means SCM and the signal expanding means SEP. Especially, in the apparatus in which the widths of the respective conversion ranges are set at $\frac{1}{2} \times Amx$, $\frac{1}{4} \times Amx$ ... with respect to the width Amx of the maximum conversion range, the provision of the signal compressing means SCM and the signal expanding means is facilitated, thereby simplifying the entire structure of the apparatus.

EXAMPLE 4

A fourth embodiment based on the recording apparatus and the reproducing apparatus described with reference to the basic arrangement of FIGS. 1 and 2 will be explained with reference to FIGS. 13 and 14.

Figure 13:
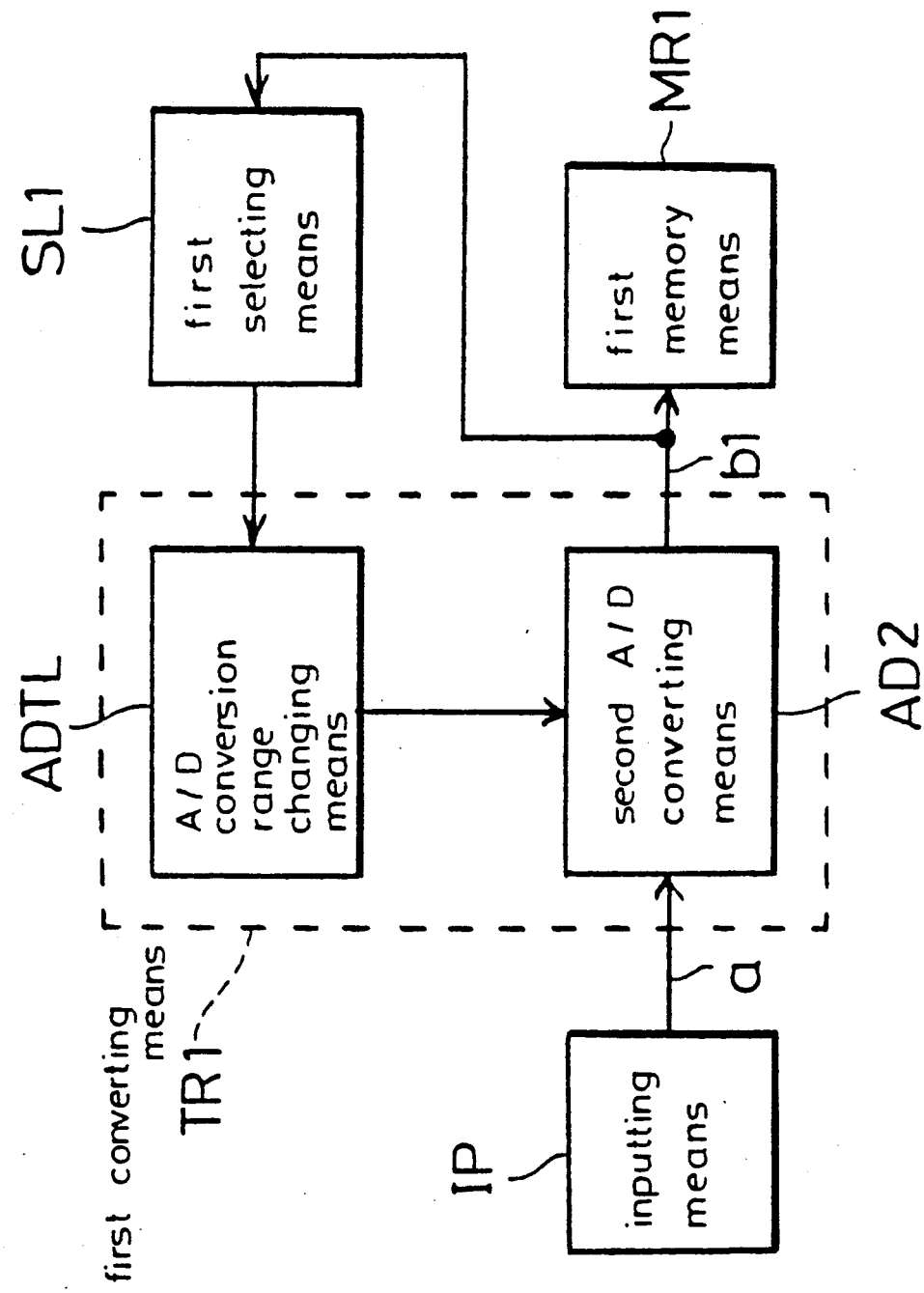
FIGS. 13 and 14 are block diagrams of a fourth embodiment of the present invention.

Although the recording apparatus shown in FIG. 13 and the reproducing apparatus shown in FIG. 14 may be independent of each other, the following explanation will be given on the assumption that the sound recorded by the recording apparatus shown in FIG. 13 is reproduced by the reproducing apparatus shown in FIG. 14, unless specified otherwise.

Figure 14:
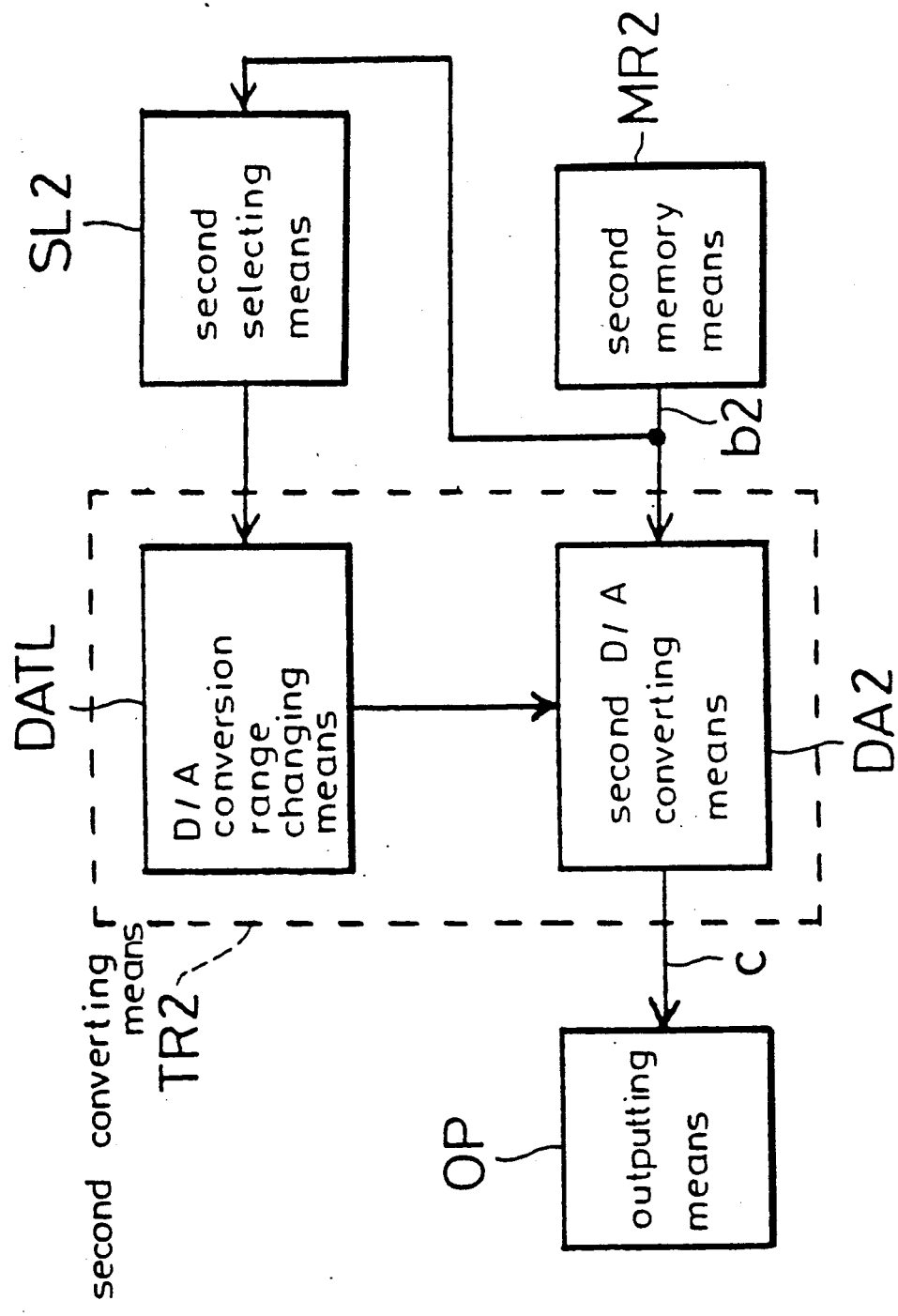

In FIG. 14, the inputting means IP, the first memory means MR1 and the first selecting means SL1 are the same as those described above with reference to the basic arrangement of FIGS. 1 and 2.

The first converting means TR1 comprises a second A/D converting means AD2 and an A/D conversion range changing means ADTL.

The second A/D converting means AD2 converts the original analog sound signal "a" into a digital signal and outputs the digital sound signal "b1". The digital sound signal "b1" is assumed to be comprised of 5 bits (1 bit thereof is a sign bit) in this embodiment.

The A/D conversion range changing means ADTL changes the maximum inputting range of the second A/D converting means AD2 in correspondence with the conversion range selected by the first selecting means SL1.

In the operation of the recording apparatus shown in FIG. 13, the maximum inputting range of the second A/D converting means AD2 is changed in correspondence with the amplitude of the original sound signal "a". For example, when the amplitude of the original sound signal "a" is large, the width of the maximum inputting range is expanded, and when the amplitude of the original sound signal "a" is small, the maximum inputting range is narrowed. This will be stated more concretely as follows:

The conversion range is selected by the first selecting means SL1 on the basis of the digital sound signal "b1", which corresponds to the amplitude of the original sound signal "a".

The A/D conversion range changing means ADTL changes the maximum input range of the second A/D converting means AD2 in correspondence with the conversion range. The maximum inputting range of the second A/D converting means AD2 can be changed, for example, by changing the reference voltage for A/D conversion.

The second A/D converting means AD2 converts the original sound signal "a" from the analog signal into a digital signal in the selected maximum inputting range to obtain the digital sound signal "b1".

In FIG. 14, the outputting means OP, the second memory means MR2 and the second selecting means SL2 are the same as those described above with reference to the basic arrangement of FIGS. 1 and 2.

The second converting means TR2 comprises a second D/A converting means DA2 and D/A conversion range changing means DATL.

The second D/A converting means DA2 converts the digital sound signal "b2" from the digital signal into an analog signal and outputs the analog sound signal "c". The digital sound signal "b2" is assumed to be composed of 5 bits (1 bit thereof is a sign bit) in this embodiment.

The D/A conversion range changing means DATL changes the maximum outputting range of the second D/A converting means DA2 in correspondence with the conversion range selected by the second selecting means SL2.

In the operation of the reproducing apparatus shown in FIG. 14, the maximum outputting range of the second D/A converting means DA 2 is changed in dependence upon the amplitude of the sound signal determined from the digital sound signal "b2". For example, when the amplitude of the sound signal determined from the digital sound signal "b2" is large, the width of the maximum outputting range is expanded, and when the amplitude thereof is small, the maximum outputting range is narrowed. This will be stated more concretely as follows:

The conversion range is selected by the second selecting means SL2 on the basis of the amplitude information (the amplitude of the second signal) of the digital sound signal "b2".

The D/A conversion range changing means DATL changes the maximum output range of the second D/A converting means DA2 in correspondence with the conversion range. The maximum outputting range of the second D/A converting means DA2 can be changed, for example, by changing the reference voltage for D/A conversion.

The second D/A converting means DA2 converts the digital sound signal "b2" into an analog signal in the selected maximum outputting range and outputs the analog sound signal "c".

In the recording apparatus and the reproducing apparatus in this embodiment, the maximum inputting range of the second A/D converting means AD2 and the maximum outputting range of the second D/A converting means DA2 are set at the optimum ranges in correspondence with the amplitude of the sound signal by the second A/D conversion range changing means ADTL and the second D/A conversion range changing means DATL, respectively, so that recording and reproduction with a high sound quality are enabled even with a small amount of information to be stored.

EXAMPLE 5

A fifth embodiment based on the recording apparatus and the reproducing apparatus described above with reference to the basic arrangement of FIGS. 1 and 2 will be explained with reference to FIGS. 15 and 16.

Figure 15:
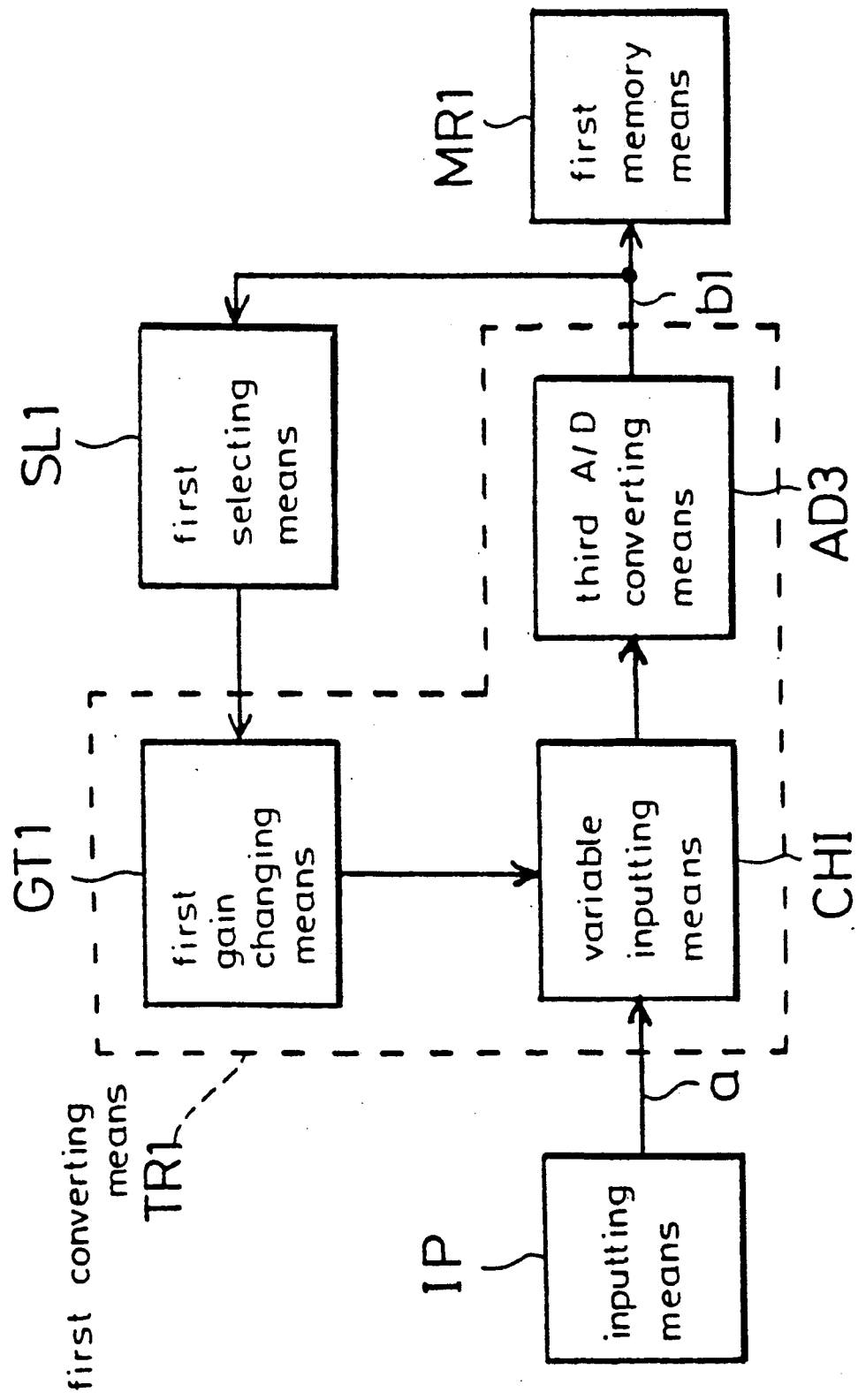
FIGS. 15 and 16 are block diagrams of a fifth embodiment of the present invention.

Although the recording apparatus shown in FIG. 15 and the reproducing apparatus shown in FIG. 16 may be independent of each other, the following explanation will be given on the assumption that the sound recorded by the recording apparatus shown in FIG. 15 is reproduced by the reproducing apparatus shown in FIG. 16, unless specified otherwise.

In FIG. 15, the inputting means IP, the first memory means MR1 and the first selecting means SL1 are the same as those described above with reference to the basic arrangement of FIGS. 1 and 2.

The first converting means TR1 is comprised of a third A/D converting mans AD3, a variable inputting means CHI and a first gain changing means GT1.

The variable inputting means CHI produces an amplification signal which is obtained by amplifying the analog original sound signal "a" and comprises an amplifier and the like. The variable inputting means CHI may either attenuate the original sound signal "a" or amplify and attenuate the original sound signal "a".

The third A/D converting means AD3 converts the amplification signal obtained by the variable inputting means CHI from the analog signal into a digital signal and outputs the digital sound signal "b1". The digital sound signal "b1" is assumed to be composed of 5 bits (1 bit thereof is a sign bit) in this embodiment.

The first gain changing means GT1 changes the gain of the variable inputting means CH1 in correspondence with the conversion range selected by the first selecting means SL1.

In the operation of the recording apparatus shown in FIG. 15, the gain (amplification) of the variable inputting means CHI is changed in correspondence with the amplitude of the original sound signal "a". For example, when the amplitude of the original sound signal "a". For example, when the amplitude of the original sound signal "a" is large, the gain is reduced, and when the amplitude of the original sound signal "a" is small, the gain is increased. This will be stated more concretely as follows:

The conversion range is selected by the first selecting means SL1 on the basis of the digital sound signal "b1", which corresponds to the amplitude of the original sound signal "a".

The first gain changing means GT1 changes the gain of the variable inputting means CHI in correspondence with the conversion range.

The variable inputting means CHI amplifies the original sound signal "a" at the selected gain.

The third A/D converting means AD3 converts the amplification signal obtained by the variable inputting mans CHI rom the analog signal into a digital signal and outputs the digital sound signal "b1" of 5 bits (1 bit thereof is a sign bit).

Figure 16:
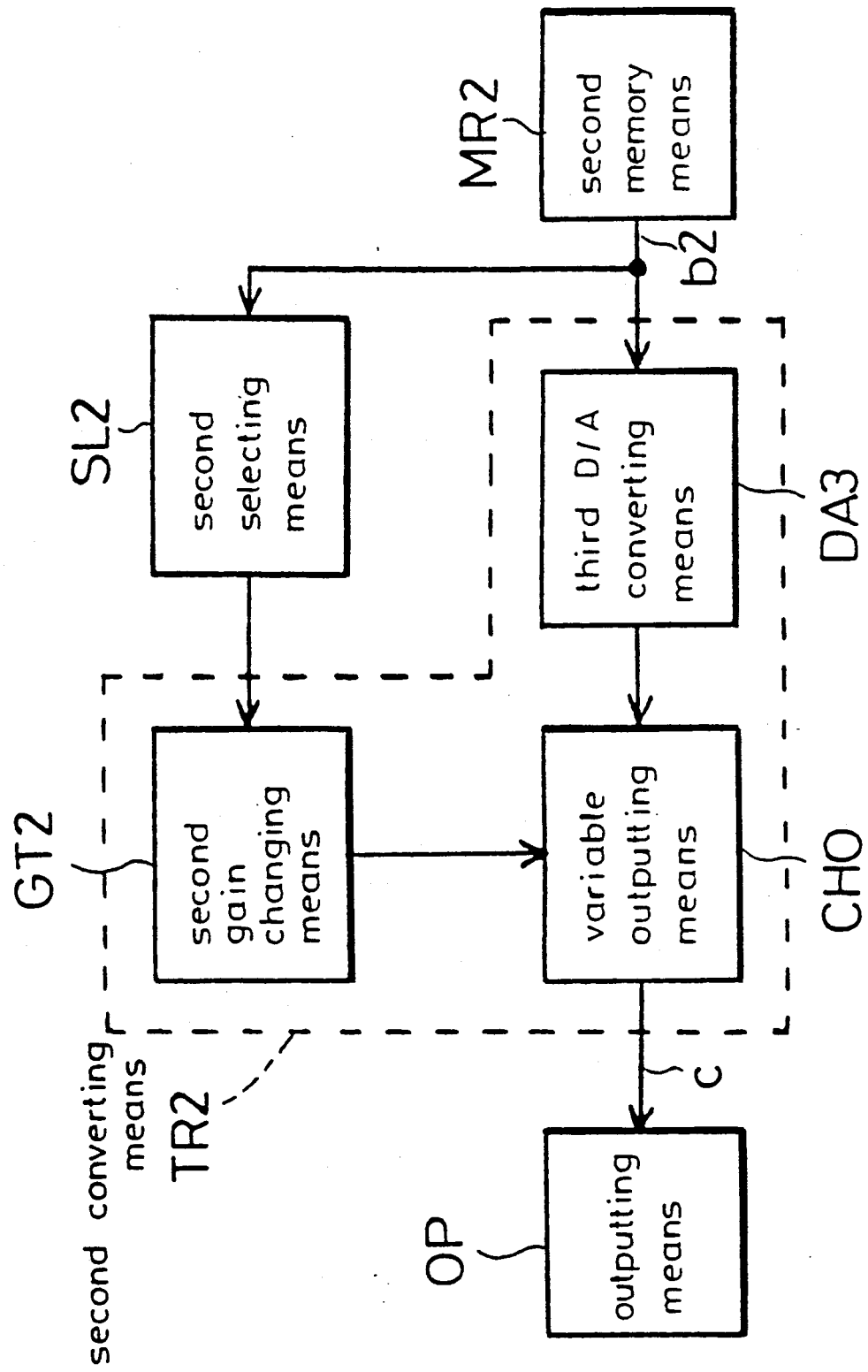

In FIG. 16, the outputting means OP, the second memory means MR2 and the second selecting means SL2 are the same as those described with reference to FIGS. 1 and 2.

The second converting means TR2 comprises a third D/A converting means DA3, a variable outputting means CHO and a second gain changing means GT2.

The third D/A converting means DA3 converts the digital sound signal "b2" from the digital signal into an analog signal and outputs the D/A conversion signal. The digital sound signal "b1" is assumed to be comprised of 5 bits (1 bit thereof is a sign bit) in this embodiment.

The variable outputting means CHO amplifies the D/A conversion signal obtained by the third D/A converting means DA3 and is composed of an amplifier and the like. The variable outputting means CHO may either attenuate the D/A conversion signal or amplify and attenuate the D/A conversion signal.

The second gain changing means GT2 changes the gain of the variable outputting means CHO in correspondence with the conversion range selected by the second selecting means SL2.

In the operation of the reproducing apparatus shown in FIG. 16, the gain (amplification) of the variable outputting means CHO is changed in correspondence with the amplitude of the sound signal judged from the digital sound signal "b2". For example, when the amplitude of the sound signal judged from the digital sound signal "b2" is large, the gain is increased, and when the amplitude thereof is small, the gain is reduced. This will be stated more concretely as follows:

The third D/A converting means DA3 converts the digital sound signal "b2" of 5 bits (1 bit thereof is a sign bit) from the digital signal to an analog signal and outputs a D/A conversion signal.

On the other hand, the second selecting means SL2 selects the conversion range on the basis of the amplification information (amplitude of the sound signal) of the digital sound signal "b2".

The second gain changing means GT2 changes the gain of the variable outputting means CHO in correspondence with the selected conversion range.

The variable outputting means CHO amplifies the D/A conversion signal at the selected gain.

In the recording apparatus and the reproducing apparatus in this embodiment, since the gain of the variable inputting means CHI and the gain of the variable outputting means CHO are set at the optimum ranges in correspondence with the amplitude of the sound signal by the first gain changing means GT1 and the second gain changing means GT2, respectively, recording and reproducing with a high sound quality are enabled even with a small amount of information to be stored.

EXAMPLE 6

Examples of the recording apparatus and the reproducing apparatus described with reference to Example 3 will be explained as a sixth embodiment with reference to FIGS. 17 and 18. This embodiment relates to examples of the signal compressing means SCM shown in FIG. 9 and the signal expanding means shown in FIG. 10.

The principle thereof will be explained before explaining the concrete structure thereof.

When selecting the width of each conversion range to vary in geometical progression, the width is represented by the following equation:

$$A = A0 \cdot B^n \quad (1)$$

wherein
A ... width of each conversion range
A0 ... width of the maximum conversion range
B ... positive number smaller than 1
n ... integer The constant of the equation (1) are represented as follows:

$$B = (\tfrac{1}{2})^{1/k} \quad (2)$$

$$n = 4i + j \quad (3)$$

wherein
k ... integer is larger than 1
i ... 0, 1, 2, ...
j ... 0, 1, 2, ..., k—1

As a result, the equation (1) is represented as follows:

$$A = A0 \cdot \{(\tfrac{1}{2})^{1/k}\}^{(4i+j)} \quad (4)$$

If it is assumed that k=4 in the equation (4), the following equation holds:

$$\begin{aligned} A &= A0 \cdot \{(1/2)^{1/4}\}^{(4i+j)} \\ &= A0 \cdot \{(1/2)^i\}\{(1/2)^{j/4}\} \end{aligned} \quad (5)$$

wherein
i ... 0, 1, 2, ...
j ... 0, 1, 2, 3

The relationship represented by the equation (5) is shown in FIG. 20. For example, if the value of "A" is observed when j=0, it is found that every time in value of "i" increased by 1, the value of "A" is reduced to ½. The same is applied when j=1, 2 and 3. That is, the width of the conversion range (the value of "A") reduced to ½ at every four ranges. When the conversion range becomes ½, the binary data is shifted by 1 bit, as described above.

The examples shown in FIGS. 17 and 18 will be explained with reference to the above-described principle.

Figure 17:
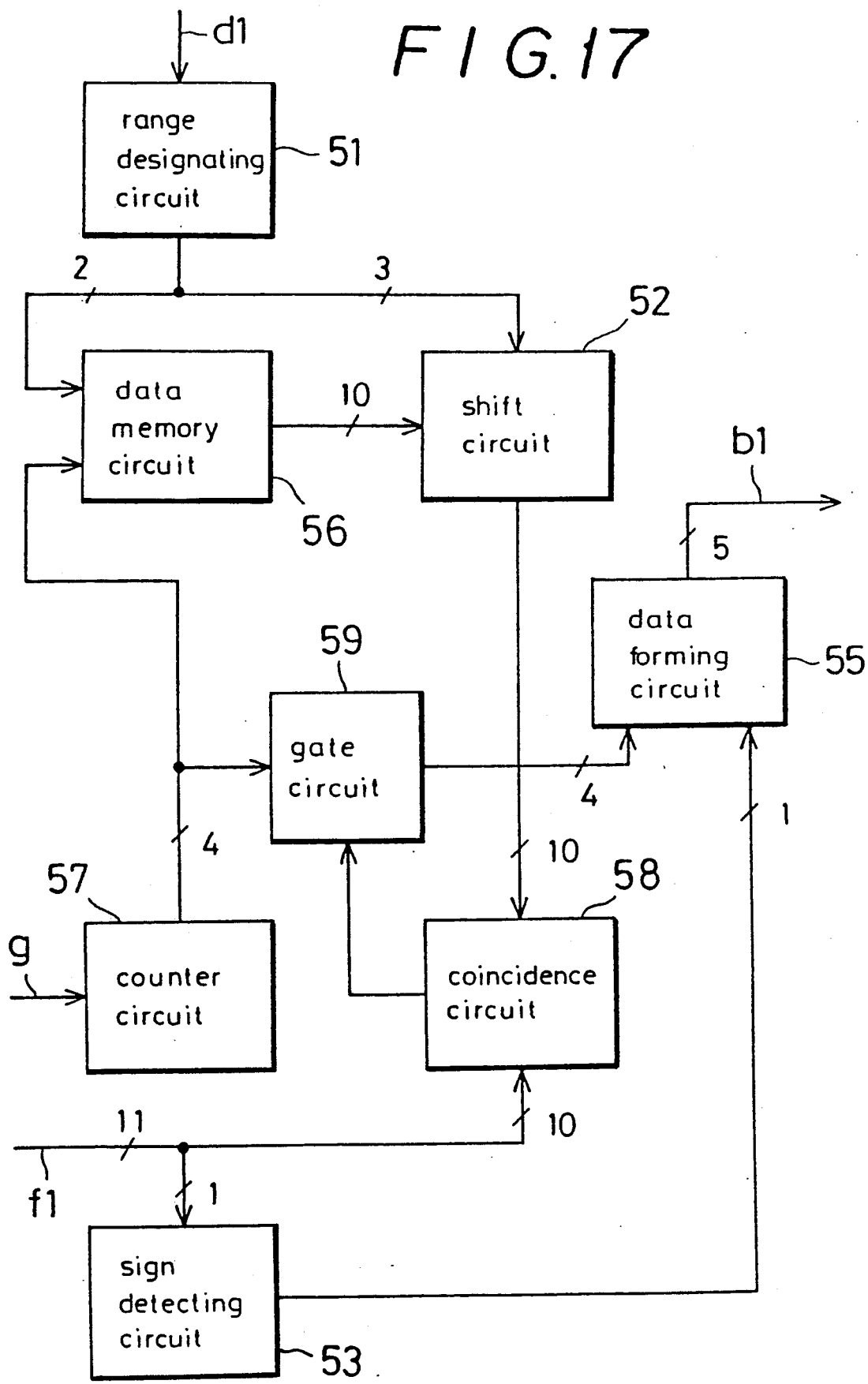

FIG. 17 shows the signal compressing means SCM in FIG. 9. The circuitry shown in this embodiment compresses the data "f1" of 11 bits (1 bit thereof is a sign bit) output from the first A/D converting means AD1 shown in FIG. 9 finally to the data "b1" of 5 bits (1 bit thereof is a sign bit) and supplies the data to the first memory means MR1 in FIG. 9.

The conversion range information "d1" is input to a range designating circuit 51 from the first selecting means SL1 in FIG. 9. The conversion range information "d1" may be either the information indicating the width of the conversion range or the information for enlarging or narrowing the conversion range. The range designating circuit 51 supplies conversion range designating information of 2 bits and the conversion range designating information of 3 bits to a later-described data memory circuit 56 and a shift circuit 52, respectively.

A clock signal "g" is input to a counter circuit 57 and the count value is subsequently increased. The counter circuit 57 is a hexadecimal counter and the count value of 4 bits is supplied to a later-described data memory circuit 56 every time 1 is added to the count value.

The data memory circuit 56 is comprised of ROM (Read Only Memory), and the first 2 bits of the address are designated by the range designating circuit 51, while the last four bits are designated by the counter circuit 57. The data structure in the data memory circuit 56 is shown in FIG. 19. Each data is divided into 4 blocks in corresponding to the conversion range. In the addresses "63", "62", . . . , "48", binary data "1111000000", "1110000000", . . . , "0000000000" are stored respectively. That is, the last 4 bits of the address and the first 4 bits of the binary data are completely the same. In the addresses "47" to "32", the data obtained by multiplying the data "960" to "0" stored in the addresses "63" to "48" with "(½)¼" are respectively stored. In the addresses "31" to "16", the data obtained by multiplying the data "960" to "0" stored in the addresses "63" to "48" with "(½)2/4" are respectively stored. In the addresses "15" to "0", the data obtained by multiplying the data "960" to "0" stored in the addresses "63" to "48" with "(½)¾" are respectively stored.

Data of 10 bits is input from the data memory circuit 56 to the shift circuit 52. The 10-bit data is the data stored in the address designated by the range designating circuit 51 and the counter circuit 57. The 10-bit data input to the shift circuit 52 is shifted by a predetermined number of bits in accordance with the range designating information of 3 bits which is supplied from the range designating circuit 51.

The sign detecting circuit 53 extracts the signal bit from the A/D conversion data "f1" of 11 bits (1 bit thereof is a sign bit) output from the first A/D converting means AD1 in FIG. 9.

A coincidence detecting circuit 58 compares the shift data (10 bits) output from the shift circuit 52 every time the 1 is added to the count value of the counter circuit 57 in accordance with the clock signal "g" with the absolute value data (10 bits) of the A/D conversion data "f1" and supplies an output when both data agree. The absolute value data can take any of $2^{10}$ different values in principle, but the values of the shift data output from the shaft circuit 52 are limited in correspondence with the binary data shown in FIG. 19. Therefore, actually, when the absolute value data is a constant range with respect to each shift data, both data are regarded as coincident data. For example, when certain absolute value data Dx is input to the coincidence detecting circuit 58, if the shift data which is not greater than the absolute value data Dx and the most approximate to the absolute value data Dx is input, both data are regarded as coincident data. When both data are coincident, a gate circuit 59 opens and the count value of the counter circuit 57 at that point is input to a later-described data forming circuit 55. Therefore, the count value at the point at which both data have coincided constitutes a compressed absolute value data of 4 bits. More specifically, at the point at which both data have coincided, the last 4 bits of the designated address of the data memory circuit 56 constitute the compressed absolute value data of 4 its at they are.

The data forming circuit 55 forms the compression data "b1" of 5 bits (4 bits are absolute value data and 1 bit sign data) on the basis of each data and supplies the compression data to the first memory means MR1.

FIG. 18 shows the signal expanding means EP in FIG. 10.

The circuitry shown in this embodiment expands the data "b2" of 5 bits (1 bit thereof is a sign bit) output from the second memory means MR2 in FIG. 10 finally to the data "f2" of 11 bits (1 bit thereof is a sign bit) and supplies the data to the first D/A converting means DA1 in FIG. 10. The data stored in the second memory means MR2 shown in FIG. 10 are the same as the data stored in the first memory circuit MR1 shown in FIG. 9.

A data separating circuit 65 separates the compression data "b2" of 5 bits which is supplied from the second memory means MR2 shown in FIG. 10 into absolute value data of 4 bits and sign data of 1 bit.

The conversion range information "d2" is supplied from the second selecting means SL2 shown in FIG. 10 to a range designating circuit 61. The conversion range information "d2" may be either the information indicating the width of the conversion range or the information for enlarging or narrowing the conversion range.

The range designating circuit 61 supplies conversion range designating information of 2 bits and the conversion range designating information of 3 bits to a data memory circuit 66 and a shift circuit 62, respectively.

The data memory circuit 66 is comprised of ROM (Read Only Memory) and the first 2 bits of the address are designated by the range designating circuit 61, while the last 4 bits are designated by the data separating circuit 65. The data structure in the data memory circuit 66 is the same as that of the data memory circuit 56 in FIG. 17. The data structure is shown in FIG. 19.

Data of 10 is input from the data memory circuit 66 to the shift circuit 62. The 10-bit data input to the shift circuit 62 is shifted by a predetermined number of bits in accordance with the range designating information of 3 bits which is supplied from the range designating circuit 61.

A data combining circuit 64 forms the expansion data "f2" from the absolute value data of 10 bits output from the shift circuit and the sign data of 1 bit output from the data separating circuit and supplies the expansion data to the first D/A converting mans DA1 in FIG. 10.

Examples of fundamental structure and the embodiments are described above. Some components in the examples of the fundamental structure and the embodiments may be used in common in the recording apparatus and the reproducing apparatus. Thus, it is easy to design a recording and reproducing apparatus which serves as both recording apparatus and reproducing apparatus by appropriately using the components in common.

It goes without saying that it is possible to combine the principle, the apparatus, etc. described in the embodiments, as occasion demands.

According to the present invention, at the time of recording, the original sound signal is converted into a digital sound signal in the conversion range selected in correspondence with the amplitude of the original sound signal and, at the time of reproduction, the digital sound signal is converted into an analog sound signal in the conversion range selected in accordance with the amplitude of the digital sound signal. Therefore, the amount of information to be stored is reduced and it is possible to produce a recording apparatus and a reproducing apparatus which can follow even a waveform having an amplitude that changes abruptly.

In the recording apparatus and the reproducing apparatus provided with a conversion range selecting means, it is possible to automatically select the conversion range. Since it is possible to automatically select the conversion range, it is unnecessary to store the conversion range information in the memory means, thereby enabling the reduction in the storage capacity.

In the recording apparatus and the reproducing apparatus provided with a control data inserting means and a control data extracting means, it is possible to store the conversion range information separately from the digital sound signal. It is therefore possible to simplify the structure of, especially, the recording apparatus.

In the recording apparatus and the reproducing apparatus provided with a signal compressing means and a signal expanding means, it is possible to reduce the amount of information to be stored. Especially, in the apparatus in which the widths of the conversion ranges are set at $\frac{1}{2}$, $\frac{1}{4}$, ... of the width of the maximum conversion range, it is easy to design the signal compressing means and the signal expanding means, thereby enabling the simplification of the entire structure of the apparatus.

In the recording apparatus and the reproducing apparatus provided with an A/D conversion range changing means and a D/A conversion range changing means, since the maximum inputting range of the A/D converting means and the maximum outputting range of the D/A converting means are set at the optimum ranges in correspondence with the amplitude of the sound signal, it is possible to record and reproduce with a high sound quality even with a small amount of information to be stored.

In the recording apparatus and the reproducing apparatus provided with a gain changing means, since the gain of a variable inputting means and a variable outputting means are set at the optimum values in correspondence with the amplitude of the sound signal, it is possible to record and reproduce with a high sound quality even with a small amount of information to be stored.

Although the present invention has been described through specific terms, it should be noted here that the described embodiments are not necessarily exclusive and the various changes and modifications may be imparted thereto without departing from the scope of the invention which is limited solely by the appended claims.

What we claim is:

1. In a recording method comprising the steps of converting an original sound signal into a digital sound signal in a selected conversion range, selecting said conversion range in accordance with amplitude information of said original sound signal, and storing and recording said digital sound signal, the improvement wherein a width A of said conversion range is:

$$A = A0 * \{(\tfrac{1}{2})^j\} * \{(\tfrac{1}{2})^{j/k}\}$$

where:
A0 is a width of a maximum conversion range,
i is a variable integer and,
k is a fixed integer and,
j is a variable integer and, and selecting means for determining i and j in accordance with said amplitude information.

2. A recording method according to claim 1, wherein said step of converting comprises forming said digital sound signal to have a constant number of bits.

3. In a recording apparatus comprising:
a first selecting means for selecting a conversion range which corresponds to amplitude information of an original sound signal;
a first converting means for converting said original sound signal into a digital sound signal in the conversion range selected by said first selecting means; and
a first memory means for storing said digital sound signal converted by said first converting means,
the improvement wherein a width A of said conversion range is:

$$A = A0 * \{(\tfrac{1}{2})^j\} * \{(\tfrac{1}{2})^{j/k}\}$$

where:
A0 is a width of a maximum conversion range,
i is a variable integer and,
k is a fixed integer and,
j is a variable integer and, and comprising means for determining i and j in accordance with said amplitude information.

4. A recording apparatus according to claim 3, wherein said digital sound signal has a constant number of bits.

5. A recording apparatus according to claim 3, wherein said first selecting means comprises:
a first amplitude level detecting means for detecting the amplitude level which corresponds to said amplitude information of said original sound signal; and
a first conversion range selecting means for selecting a conversion range on the basis of the information on said amplitude level detected by said first amplitude level detecting means.

6. A recording apparatus according to claim 3, wherein said first memory means stores the information on said conversion range selected by said first selecting means as well as said digital sound signal.

7. A recording apparatus according to claim 3, wherein said first converting means comprises:
   a first A/D converting means for converting said original sound signal from the analog signal into a digital signal; and
   a signal compressing means for converting the A/D conversion signal obtained by said first A/D converting means into a compression signal of a smaller number of its than the number of bits of said A/D conversion signal in the conversion range selected by said first selecting means so as to obtain said digital sound signal.

8. A recording apparatus according to claim 3, wherein said first converting means comprises:
   a second A/D converting means for converting said original sound signal from the analog signal into a digital signal; and
   an A/D conversion range changing means for changing the maximum inputting range of said second A/D converting means in correspondence with the conversion range selected by said first selecting means.

9. A recording apparatus according to claim 8, wherein said first converting means comprises:
   a variable inputting means for generating a signal by amplifying and/or attenuating said original sound signal;
   third A/D converting means or converting said signal obtained from said variable inputting means from the analog signal into a digital signal; and
   a first gain changing means for changing the gain of said variable inputting means in correspondence with the conversion range selected by said first selecting means.

10. In a reproducing method comprising the steps of reading a recorded digital sound signal, converting said digital sound signal into an analog sound signal in a selected conversion range, selecting said range in correspondence with amplitude information of said digital sound signal, and reproducing said analog sound signal, the improvement wherein a width A of said conversion range is:

$$A = A0 * \{(\tfrac{1}{2})^i\} * \{(\tfrac{1}{2})^{j/k}\}$$

where:
A0 is a width of a maximum conversion range,
i is a variable integer and,
k is a fixed integer and,
j is a variable integer and,
and selecting means for determining i and j in accordance with said amplitude information.

11. A reproducing method according to claim 10, wherein said digital sound signal has a constant number of bits.

12. In a reproducing apparatus comprising:
   a memory means for storing a digital sound signal;
   a selecting means for selecting a conversion range which corresponds to the amplitude information of said digital sound signal; and
   a converting means for converting said digital sound signal into an analog sound signal in said conversion range selected by said selecting means,
   the improvement wherein a width A of said conversion range is:

$$A = A0 * \{(\tfrac{1}{2})^i\} * \{(\tfrac{1}{2})^{j/k}\}$$

where:
A0 is a width of a maximum conversion range,
i is a variable integer and,
k is a fixed integer and,
j is a variable integer and,
and comprising means for determining i and j in accordance with said amplitude information.

13. A reproducing apparatus according to claim 12, wherein said digital sound signal has a constant number of bits.

14. A reproducing apparatus according to claim 12, wherein said selecting means comprises:
   an amplitude level detecting means for detecting the amplitude level which corresponds to said amplitude information of said digital sound signal; and
   a conversion range selecting means for selecting a conversion range on the basis of the information on said amplitude level detected by said amplitude level detecting means.

15. A reproducing apparatus according to claim 12, wherein said memory means is coupled to store information on said conversion range selected by said selecting means as well as said digital sound signal.

16. A reproducing apparatus according to claim 12, wherein said converting means comprises:
   a signal expanding means for expanding said digital sound signal into an expansion signal of a larger number of bits than the number of bits of said digital sound signal in the conversion range selected by said selecting means; and
   a D/A converting means for converting said expansion signal obtained by said signal expanding means from the digital signal into an analog signal.

17. A reproducing apparatus according to claim 12, wherein said converting means comprises:
   a second D/A converting means for converting said digital sound signal from the digital signal into an analog signal; and
   a D/A conversion range changing means for changing the maximum outputting range of said second D/A converting means in correspondence with the conversion range selected by said selecting means.

18. A reproducing apparatus according to claim 12, wherein said converting means comprises:
   a second D/A converting means for converting said digital sound signal from the digital signal into an analog signal;
   a variable outputting means for amplifying and/or attenuating the signal obtained by said second D/A converting means; and
   a gain changing means for changing the gain of said variable outputting means in correspondence with the conversion range selected by said selecting means.

19. In a recording apparatus having a first amplitude level detecting means for detecting an amplitude level which corresponds to amplitude information of an original sound signal and outputting a digital amplitude signal which corresponds to the original sound signal; a first conversion range selecting means for selecting a conversion range on a basis of the digital amplitude signal; a first converting means for converting the original sound signal into a digital sound signal in the conversion range selected by the first conversion range selecting means; and a first memory means for storing the digital sound signal converted by the first converting means;

the improvement wherein said first conversion range selecting means comprises a comparator for generating a range over signal when a value of the digital amplitude signal is larger than a maximum value in the conversion range currently selected; and a conversion range specifying circuit for enlarging the conversion range by one stage when a count value of the range over signal generated within a fixed period is greater than a predetermined value.

20. A recording apparatus having a first amplitude level detecting means for detecting an amplitude level which corresponds to amplitude information of an original sound signal and outputting a digital amplitude signal which corresponds to the original sound signal; a first conversion range selecting means for selecting a conversion range on a basis of the digital amplitude signal; a first converting means for converting the original sound signal into a digital sound signal in the conversion range selected by the first conversion range selecting means; and a first memory means for storing the digital sound signal converted by the first converting means;

the improvement wherein said first conversion range selecting means comprises a comparator for generating a range over signal when a value of the digital amplitude signal is larger than a maximum value in the conversion range one stage narrower than the conversion range currently selected; a conversion range specifying circuit for narrowing the conversion range by one stage when a count value of the range over signal generated with a fixed period is smaller than a predetermined value.

21. In a recording apparatus having a first amplitude level detecting means for detecting an amplitude level which corresponds to amplitude information of an original sound signal and outputting a digital amplitude signal which corresponds to the original sound signal; a first conversion range selecting means for selecting a conversion range on a basis of the digital amplitude signal; a first converting means for converting the original sound signal into a digital sound signal in the conversion range selected by the first conversion range selecting means; and a first memory means for storing the digital sound signal converted by the first converting means;

the improvement wherein said first conversion range selecting means comprises a comparator for generating a first range over signal when a value of the digital amplitude signal is larger than a maximum value in the conversion range currently selected and generating a second range over signal when the value of the digital amplitude signal is larger than the maximum value in the conversion range one stage narrower than the conversion range currently selected; a conversion range specifying circuit for enlarging the conversion range by one stage when a count value of the first range over signal generated within a fixed period is greater than a first predetermined value and narrowing the conversion range by one stage when a count value of the second range over signal generated with a fixed period is smaller than a second predetermined value.

22. In a reproducing apparatus having a second memory means for storing a digital sound signal; a second amplitude level detecting means for detecting an amplitude level which corresponds to amplitude information of the digital sound signal and outputting a digital amplitude signal which corresponds to the digital sound signal; a second conversion range selecting means for selecting a conversion range on a basis of the digital amplitude signal; a converting means for converting the digital sound signal into an analog sound signal in the conversion range selected by the second conversion range selecting means;

the improvement wherein said first conversion range selecting means comprises a comparator for generating a range over signal when a value of the digital amplitude signal is larger than a maximum value in the conversion range currently selected; a conversion range specifying circuit for enlarging the conversion range by one stage when a count value of the range over signal generated within a fixed period is greater than a predetermined value.

23. In a reproducing apparatus having a second memory means for storing a digital sound signal; a second amplitude level detecting means for detecting an amplitude level which corresponds to amplitude information of the digital sound signal and outputting a digital amplitude signal which corresponds to the digital sound signal; a second conversion range selecting means for selecting a conversion range on a basis of the digital amplitude signal; a converting means for converting the digital sound signal into an analog sound signal in the conversion range selected by the second conversion range selecting means;

the improvement wherein said second conversion range selecting means comprises a comparator for generating a range over signal when a value of the digital amplitude signal is larger than a maximum value in the conversion range one stage narrower than the conversion range currently selected; a conversion range specifying circuit for narrowing the conversion range by one stage when a count value of the range over signal generated within a fixed period is smaller than a predetermined value.

24. In a reproducing apparatus having a second memory means for storing a digital sound signal; a second amplitude level detecting means for detecting an amplitude level which corresponds to amplitude information of the digital sound signal and outputting a digital amplitude signal which corresponds to the digital sound signal; a second conversion range selecting means for selecting a conversion range on a basis of the digital amplitude signal; a converting means for converting the digital sound signal into an analog sound signal in the conversion range selected by the second conversion range selecting means;

the improvement wherein said first conversion range selecting means comprises a comparator for generating a range over signal when a value of the digital amplitude signal is larger than a maximum value in the conversion range currently selected and generating a second range over signal when the value of the digital amplitude signal is larger than the maximum value in the conversion range one stage narrower than the conversion range currently selected; a conversion range specifying circuit for enlarging the conversion range by one stage when a count value of the first range over signal generated within a fixed period is greater than a first predetermined value and narrowing the conversion range by one stage when a count value of the second range over signal generated within a fixed period is smaller than a second predetermined value.

* * * * *